(12) United States Patent
Rhee et al.

(10) Patent No.: US 11,895,922 B2
(45) Date of Patent: Feb. 6, 2024

(54) ETCHING METHOD FOR FORMING VERTICAL STRUCTURE, ELECTRONIC DEVICE INCLUDING VERTICAL STRUCTURE FORMED BY THE ETCHING METHOD, AND METHOD OF MANUFACTURING THE ELECTRONIC DEVICE

(71) Applicant: SAMSUNG ELECTRONICS CO., LTD., Suwon-si (KR)

(72) Inventors: Choongho Rhee, Anyang-si (KR); Sungchan Kang, Hwaseong-si (KR); Yongseop Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 391 days.

(21) Appl. No.: 17/224,254

(22) Filed: Apr. 7, 2021

(65) Prior Publication Data

US 2022/0158074 A1 May 19, 2022

(30) Foreign Application Priority Data

Nov. 16, 2020 (KR) .......................... 10-2020-0153081

(51) Int. Cl.
 *H10N 30/30* (2023.01)
 *G01L 1/16* (2006.01)
 *H10N 30/082* (2023.01)

(52) U.S. Cl.
 CPC ............. *H10N 30/302* (2023.02); *G01L 1/16* (2013.01); *H10N 30/082* (2023.02); *H10N 30/306* (2023.02)

(58) Field of Classification Search
 CPC .. H10N 30/302; H10N 30/306; H10N 30/082; G01L 1/16; B81C 1/00412; B81C 1/00404
 See application file for complete search history.

(56) References Cited

U.S. PATENT DOCUMENTS

| | | | | |
|---|---|---|---|---|
| 5,045,417 A | * | 9/1991 | Okamoto | .................. G03F 1/30 430/311 |
| 5,286,343 A | * | 2/1994 | Hui | ...................... H01L 21/3083 156/345.19 |
| 5,338,400 A | | 8/1994 | Jerman | |
| 6,130,010 A | * | 10/2000 | Ishio | ..................... G01P 15/123 430/5 |

(Continued)

FOREIGN PATENT DOCUMENTS

| | | | | |
|---|---|---|---|---|
| CN | 113078057 A | * | 7/2021 | ......... H01L 21/3086 |
| JP | 06275850 A | * | 9/1994 | |

(Continued)

*Primary Examiner* — Octavia Davis Hollington
(74) *Attorney, Agent, or Firm* — Sughrue Mion, PLLC

(57) ABSTRACT

An etching method for forming a vertical structure is provided. The etching method may include: positioning a mask on a substrate, wherein the mask includes an opening pattern and a compensation pattern, and the compensation pattern is disposed at a corner of two adjacent sides of the opening pattern and includes a concave compensation pattern that is indented from one of the two adjacent sides; and forming the vertical structure on the substrate through the opening pattern of the mask by a dry etching process.

21 Claims, 25 Drawing Sheets

(56) References Cited

U.S. PATENT DOCUMENTS

| | | | | |
|---|---|---|---|---|
| 6,596,466 | B1 * | 7/2003 | Pohland | ............... H10B 10/00 |
| | | | | 430/311 |
| 7,157,016 | B2 * | 1/2007 | Steinberg | ............... B81C 1/00 |
| | | | | 216/57 |
| 9,036,105 | B2 | 5/2015 | Oh et al. | |

FOREIGN PATENT DOCUMENTS

| | | | |
|---|---|---|---|
| JP | 2005-051253 A | | 2/2005 |
| JP | 4224962 B2 | * | 2/2009 |
| KR | 10-2001-0081841 A | | 8/2001 |
| KR | 10-2006-0077880 A | | 7/2006 |
| KR | 101166620 B1 | * | 7/2012 |
| KR | 10-1284287 B | | 7/2013 |
| RU | 2331137 C1 | * | 8/2008 |

* cited by examiner

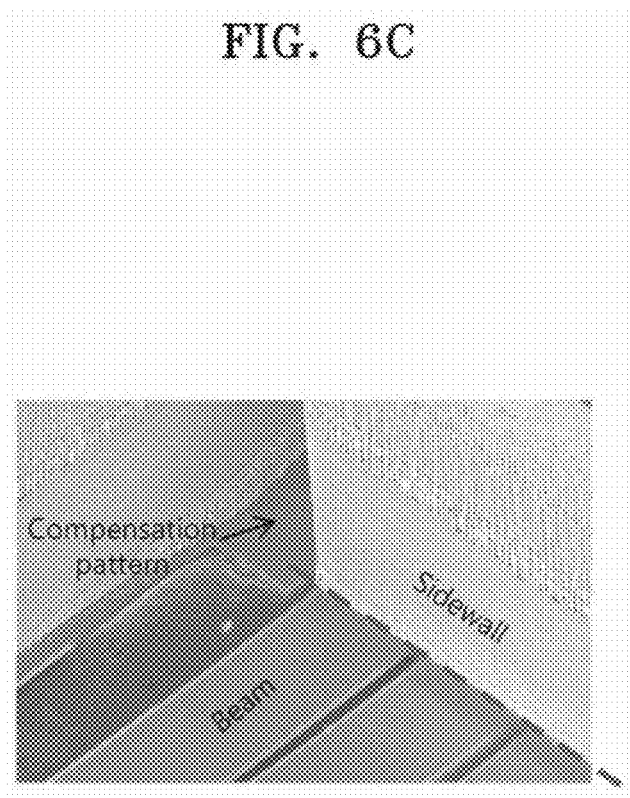

ETCHING METHOD FOR FORMING VERTICAL STRUCTURE, ELECTRONIC DEVICE INCLUDING VERTICAL STRUCTURE FORMED BY THE ETCHING METHOD, AND METHOD OF MANUFACTURING THE ELECTRONIC DEVICE

CROSS-REFERENCE TO RELATED APPLICATION

This application is based on and claims priority under 35 U.S.C. § 119 to Korean Patent Application No. 10-2020-0153081, filed on Nov. 16, 2020 in the Korean Intellectual Property Office, the disclosure of which is incorporated herein by reference in its entirety.

BACKGROUND

1. Field

The present disclosure relates to an etching method for forming a vertical structure and an electronic device and a method of manufacturing the same, the method implementing the etching method.

2. Description of the Related Art

A bulk micro-machining process, for example, a wet etching process or a dry etching process, is implemented in a thickness direction of a bulk substrate (for example, a wafer) to form a vertical structure such as a back cavity or a through-hole.

In the case of wet etching, due to a difference between etch rates according to crystallization directions, a side wall inclination in the crystallization direction may occur and an undercut in a corner area may occur.

In the case of dry etching, etching may be performed in a vertical direction of the bulk substrate. However, in dry etching, a tail may remain in a corner area, and thus, a round corner may be formed. Thus, a structure dimension around side walls of a vertical structure may be changed, thus affecting performance of an electronic device that is manufactured to have the vertical structure. For example, in the case of a device having a floating structure, a change in vibration frequency may occur. To obtain a distance between the side walls in order to prevent the effect of the tail remaining in the corner area, an additional space may be required, and thus, a die size may be increased and die density in a wafer may be decreased.

SUMMARY

One or more example embodiments may provide an etching method for forming a vertical structure without a tail remaining at a corner of the vertical structure, an electronic device including the vertical structure, and a method of manufacturing the electronic device.

Additional aspects will be set forth in part in the description which follows and, in part, will be apparent from the description, or may be learned by practice of the presented embodiments of the disclosure.

According to an aspect of an example embodiment, there is provided an etching method for forming a vertical structure, the etching method including: positioning a mask on a substrate, the mask comprising an opening pattern and a compensation pattern, the compensation pattern being disposed at a corner of two adjacent sides of the opening pattern, and comprising a concave compensation pattern that is indented from one of the two adjacent sides; and forming the vertical structure on the substrate through the opening pattern of the mask by a dry etching process.

The opening pattern may be formed in the mask, in a shape in which the compensation pattern is subtracted from a target pattern.

The vertical structure formed on the substrate by the dry etching process may include: a first side wall and a second side wall respectively corresponding to the two adjacent sides of the mask; and an indented structure formed at a corner of the first and the second side walls corresponding to the compensation pattern of the mask.

The indented structure may correspond to an extension of the vertical structure.

The indented structure may be formed along the first side wall to be indented from the second side wall, or is formed along the second side wall to be indented from the first side wall.

The forming the vertical structure may include: forming a floating structure in the vertical structure to protrude from the second side wall when the indented structure is formed along the first side wall, and forming the floating structure in the vertical structure to protrude from the first side wall when the indented structure is formed along the second side wall.

The concave compensation pattern may include a right angle pattern or a round pattern.

The opening pattern of the mask may have a polygonal shape, and the concave compensation pattern may be formed at one or more corners of the opening pattern having the polygonal shape.

The opening pattern of the mask may include a plurality of steps, and the concave compensation pattern may be formed in at least one step of the plurality of steps to extend from the at least one step.

The opening pattern of the mask may include a plurality of steps, and the concave compensation pattern may be formed in at least one step of the plurality of steps to extend from the at least one step or to be indented from the at least one step.

The substrate may include a silicon substrate.

The vertical structure may correspond to a back cavity or a through-hole having the first and the second side walls.

The compensation pattern may be formed along a first side of the two adjacent sides to be indented from a second of the two adjacent sides. When a width and a length of the compensation pattern are respectively W and L, and a distance between the floating structure that protrudes from a second side wall of the vertical structure corresponding to the second side, and a first side wall of the vertical structure corresponding to the first side, is D, a size of the compensation pattern and the distance between the floating structure and the first side may satisfy any one of a first condition in which 50<W and D>200, a second condition in which 50<W<150, L≥1.3 W, and D>W, and a third condition in which 150≤W, L≥W, and D>W.

According to an aspect of another example embodiment, there is provided a method of manufacturing an electronic device including the vertical structure.

According to an aspect of another example embodiment, there is provided an electronic device including: an electronic sensor comprising a vertical structure and a floating structure that are disposed on a substrate, wherein the vertical structure may include an indented structure disposed at a corner of two adjacent side walls, and the floating structure may protrude from one of the two adjacent side walls of the vertical structure.

The electronic sensor may be a sound sensor configured to detect a sound signal through the vertical structure and the floating structure, or a pressure sensor configured to detect a pressure signal through the vertical structure and the floating structure.

The vertical structure may be formed in the substrate by applying an etching method, wherein the etching method may include: positioning a mask on the substrate, the mask comprising an opening pattern and a compensation pattern, the compensation pattern being disposed at a corner of two adjacent sides of the opening pattern, and comprising a concave compensation pattern that is indented from one of the two adjacent sides and forming the vertical structure on the substrate through the opening pattern of the mask by a dry etching process, wherein the compensation pattern may be formed along a first side of the two adjacent sides to be indented from a second side of the two adjacent sides. When a width and a length of the compensation pattern are respectively W and L, and a distance between the floating structure that protrudes from a second side wall of the vertical structure corresponding to the second side, and a first side wall of the vertical structure corresponding to the first side, is D, the vertical structure may be formed in the substrate such that a size of the compensation pattern and the distance between the floating structure and the first side satisfy any one of a first condition in which 50<W and D>200, a second condition in which 50<W<150, L≥1.3 W, and D>W, and a third condition in which 150≤W, L≥W, and D>W.

The substrate may include a silicon substrate.

The vertical structure may correspond to a back cavity or a through-hole having the first and the second side walls.

The vertical structure may be formed in a state in which the floating structure is coupled to the substrate.

The floating structure may be coupled to the substrate after the vertical structure is formed.

The vertical structure may correspond to a through-hole, the floating structure may include a support portion extending from the substrate, and the through-hole may be formed around the support portion.

BRIEF DESCRIPTION OF THE DRAWINGS

The above and/or other aspects will be more apparent by describing certain example embodiments, with reference to the accompanying drawings, in which:

FIGS. 6A through 6C are diagrams of a sample of a vertical structure formed by applying an etching method for forming a vertical structure according to an example embodiment, wherein FIG. 6A is a schematic top view image, FIG. 6B is a schematic bottom view image, and FIG. 6C is a schematic rear three-dimensional image;

DETAILED DESCRIPTION

Figure 1:
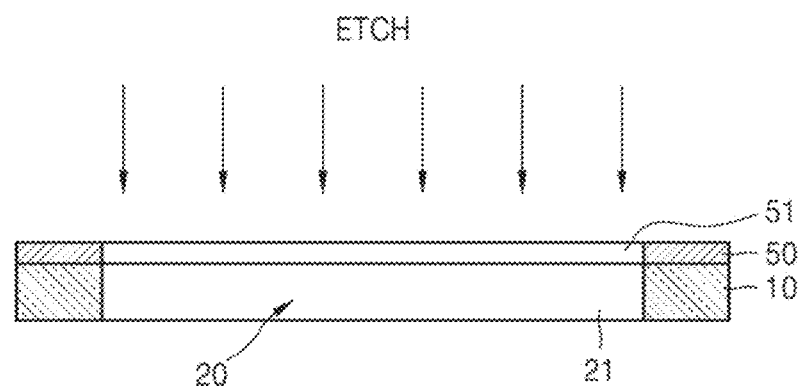
FIGS. 1 and 2 are schematic diagrams of an etching process for forming a vertical structure, according to an example embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples. In the drawings, the same reference numerals denote the same elements and sizes of elements may be exaggerated for clarity and convenience of explanation. Also, the embodiments described hereinafter are only examples, and various modifications may be made based on the embodiments.

Hereinafter, it will be understood that when an element is referred to as being "on" or "above" another element, the element can be directly over or under the other element and directly on the left or on the right of the other element, or intervening elements may also be present therebetween. Although the terms first, second, etc. may be used herein to describe various elements, these terms are only used to distinguish one element from another. These terms are not used to define differences of materials or structures between the elements. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements. The term "the" and other equivalent determiners may correspond to a singular referent or a plural referent.

Figure 2:
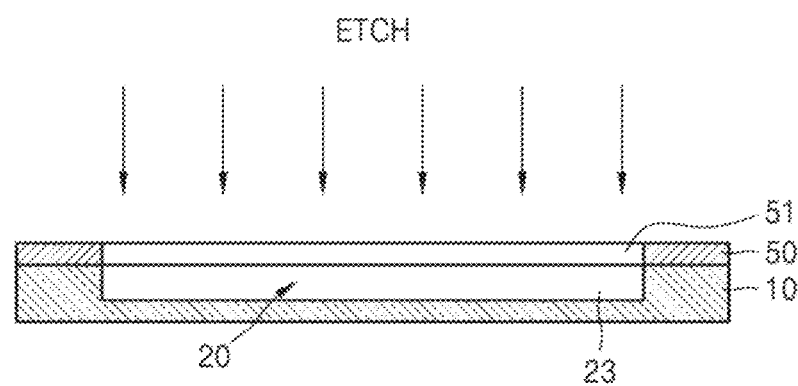
Figure 3:
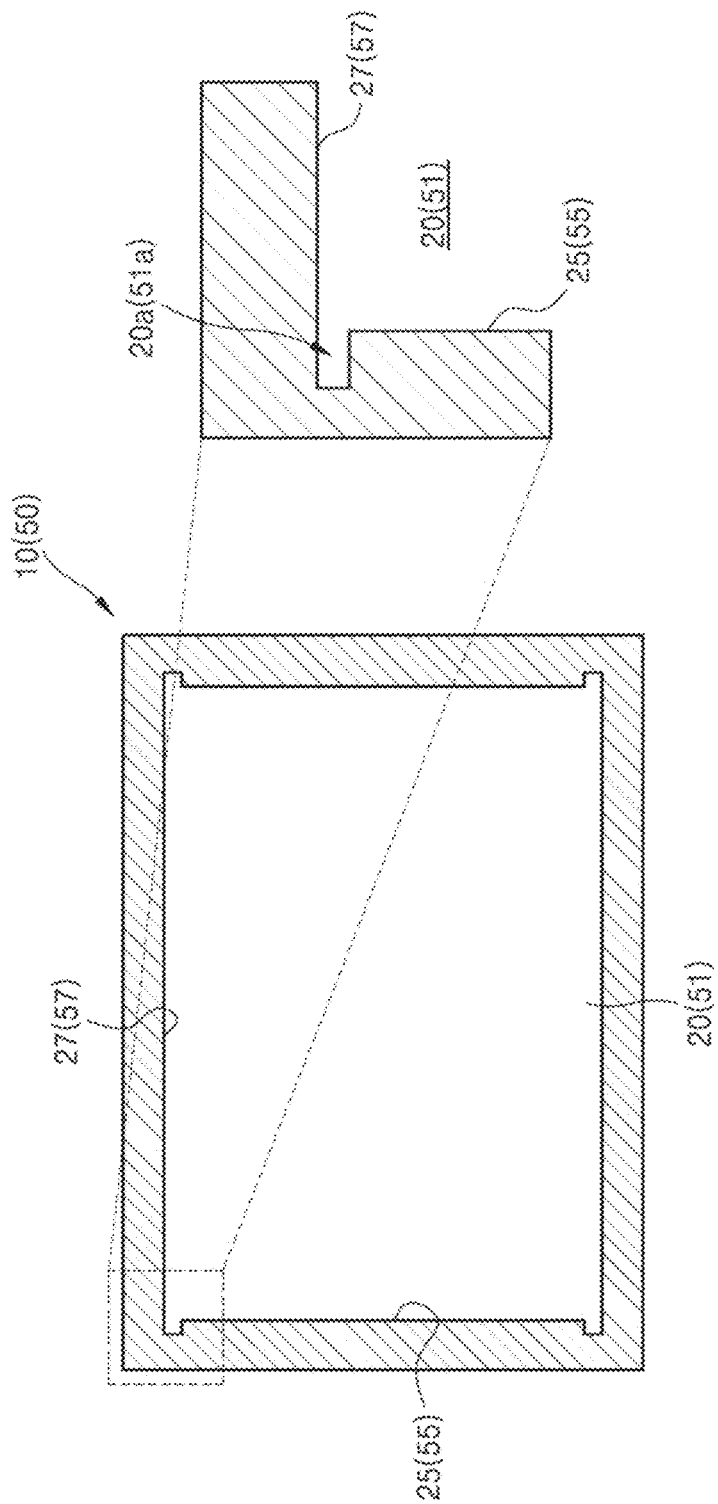
FIG. 3 is a plan view of an example of a shape of a mask applied to the etching process of FIGS. 1 and 2 and a shape of a vertical structure formed on a substrate by a dry etching process.

FIGS. 1 and 2 are schematic diagrams of an etching process for forming a vertical structure 20 according to an example embodiment. FIG. 1 is the diagram of an example in which a through-hole 21 is formed on a substrate 10 by a dry etching process, and FIG. 2 is the diagram of an example in which a back cavity (for example, a membrane) 23 is formed on the substrate 10 by a dry etching process. FIG. 3 is a plan view of examples of a shape of a mask 50 applied to the etching process of FIGS. 1 and 2 and a shape of the vertical structure 20 formed on the substrate 10 by the dry etching process. A shape of an opening pattern 51 of the mask 50 and a shape of the vertical structure 20 formed on the substrate 10 by the dry etching process through the opening pattern 51 are substantially the same as each other. Thus, in FIG. 3, the opening pattern 51 of the mask 50 and the vertical structure 20 formed on the substrate 10 by the etching process are illustrated on the same plane with the reference numerals written side by side.

Referring to FIGS. 1 through 3, according to the etching method for forming the vertical structure 20 according to an example embodiment, the mask 50 having the opening pattern 51 may be located on the substrate 10, and the vertical structure 20 may be formed on the substrate 10 through the opening pattern 51 of the mask 50 by the dry etching process. The opening pattern 51 may include a first side 55 and a second side 57 that are adjacent to or in contact with each other.

Figure 17:
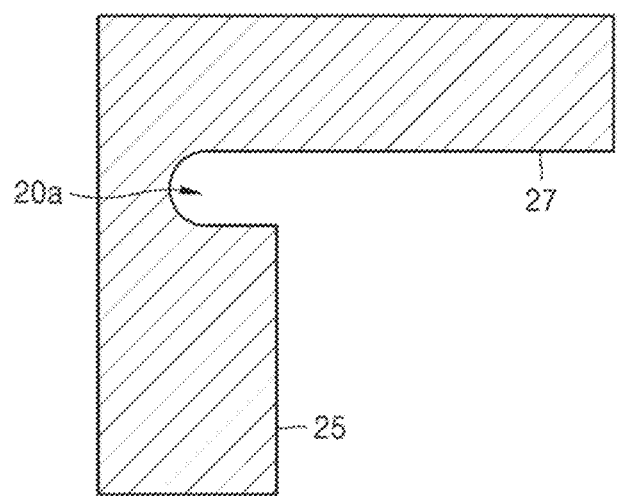
FIG. 17 is a schematic plan view of an example of a vertical structure formed on a substrate by applying an etching process according to an example embodiment, when a concave compensation pattern is a round pattern.

Here, the mask 50 may further include a compensation pattern 51a that is formed at a corner of two adjacent sides of the opening pattern 51, such as for example, the first side 55 and the second side 57. The compensation pattern 51a may correspond to a concave compensation pattern 51a that is indented from the first side 55 or the second side 57. The concave compensation pattern 51a may be an indentation at the corner of two adjacent sides (e.g., the first side 55 and the second side 57) of the mask 50. The concave compensation pattern 51a may include, for example, a right angle pattern as illustrated in FIG. 3. As another example, the concave compensation pattern 51a may include a round pattern as illustrated in FIG. 17. In FIG. 3 and the drawings hereinafter, the concave compensation pattern 51a corresponds to the right angle pattern. However, it is only an example, and the embodiments of the disclosure are not limited thereto. The concave compensation pattern 51a may include a round pattern or other various patterns.

The opening pattern 51 of the mask 50 may be formed, for example, in a shape in which the compensation pattern 51a is further subtracted from a target pattern. Also, the opening pattern 51 of the mask 50 may have a shape corresponding to the vertical structure 20 that is to be formed on the substrate 10.

For example, when the vertical structure 20 having a square shape or a deformed square shape (e.g., a cut-cornered square shape, a square shape with protruded vertices, a square shape with indented vertices, etc.) is to be formed on the substrate 10, the opening pattern 51 of the mask 50 may have a square shape or a deformed square shape (e.g., a cut-cornered square shape, a square shape with protruded vertices, a square shape with indented vertices, etc.), as illustrated in FIG. 3. Also, the compensation pattern 51a may be formed in a subtracted shape at one or more of four corner areas, at which two sides of the opening pattern 51 meet each other. FIG. 3 illustrates an example in which the compensation pattern 51a is formed at each of the four corner areas of a square shape.

By referring to a partially enlarged portion of FIG. 3, for example, the opening pattern 51 of the mask 50 may have the first side 55 and the second side 57, and the compensation pattern 51a may be formed at a corner area in which the first side 55 and the second side 57 meet each other. Here, the compensation pattern 51a may be formed in the subtracted type. That is, the compensation pattern 51a may be formed along the second side 57 to be indented from the first side 55.

During a dry etching process, while the mask 50 having the opening pattern 51 is located on the substrate 10, the vertical structure 20 (e.g., a through-hole or a back cavity) may be formed on the substrate 10 by the etching process to have a shape corresponding to the shape of the opening pattern 51 of the mask 50.

The vertical structure 20 formed on the substrate 10 may have a first side wall 25 and a second side wall 27 respectively corresponding to the first side 55 and the second side 57 of the opening pattern 51 of the mask 50. Also, an indented structure 20a may be formed in a corner area of the first and second side walls 25 and 27, the corner area corresponding to the compensation pattern 51a of the mask 50.

Here, the indented structure 20a may correspond to an extension of the vertical structure 20. That is, the indented structure 20a may be formed along one of the first and second side walls 25 and 27 of the vertical structure 20 to be indented from the other. For example, when the compensation pattern 51a of the opening pattern 51 of the mask 50 is formed in a subtracted type along the second side 57 to be indented from the first side 55, the indented structure 20a of the vertical structure 20 may be formed along the second side wall 27 to be indented from the first side wall 25. Accordingly, the first side wall 25 and the second side wall 27 may be precisely formed without a tail therebetween, and thus, the vertical structure 20 having no change of a dimension of a structure around the side walls may be formed.

Figure 4A:
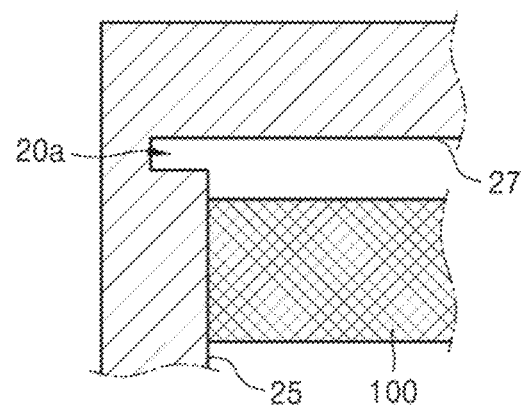
FIGS. 4A and 4B are respectively a schematic plan view and a schematic side view of an example of a vertical structure formed on a substrate by applying an etching process according to an example embodiment.
Figure 4B:
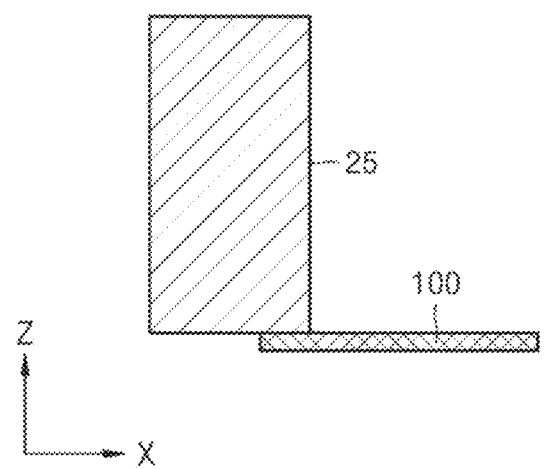

Thus, when, as illustrated in FIGS. 4A and 4B, a floating structure 100, such as a cantilever, etc., is provided to protrude from the first side wall 25 toward a space of the vertical structure 20 including the first side wall 25, an additional space for securing a distance between the floating structure 100 and the second side wall 27 may not be required. Thus, when a plurality of devices are manufactured by a wafer process, sizes of dies may be sufficiently decreased, and a density of dies in a wafer may be sufficiently increased.

FIG. 3 illustrates the example in which the opening pattern 51 of the mask 50 and the vertical structure 20 each have a square shape or a deformed square shape.

As another example, the opening pattern 51 of the mask 50 and the vertical structure 20 may have a polygonal shape or a deformed polygonal shape.

Figure 13:
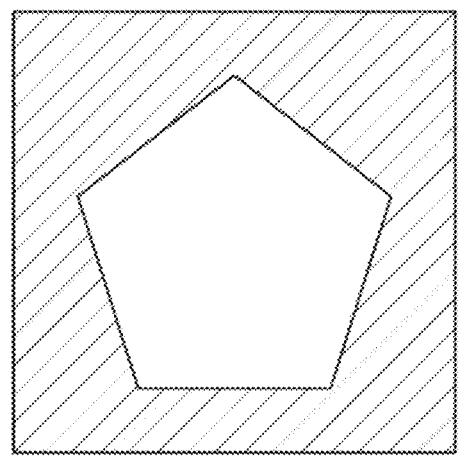
FIG. 13 is a diagram of an example of a polygonal shape.
Figure 14A:
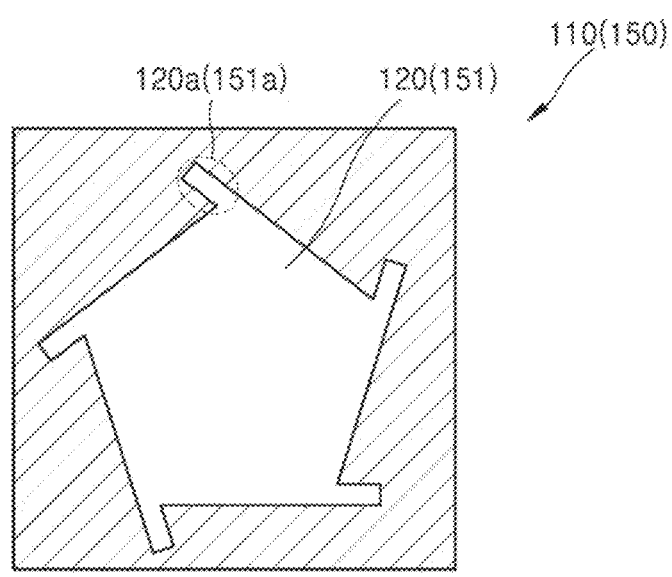
FIGS. 14A and 14B are diagrams of examples of an opening pattern of a mask applied to form a vertical structure having a polygonal shape, and the vertical structure of a substrate formed by a dry etching process to have a shape corresponding to a shape of the opening pattern of the mask.
Figure 14B:
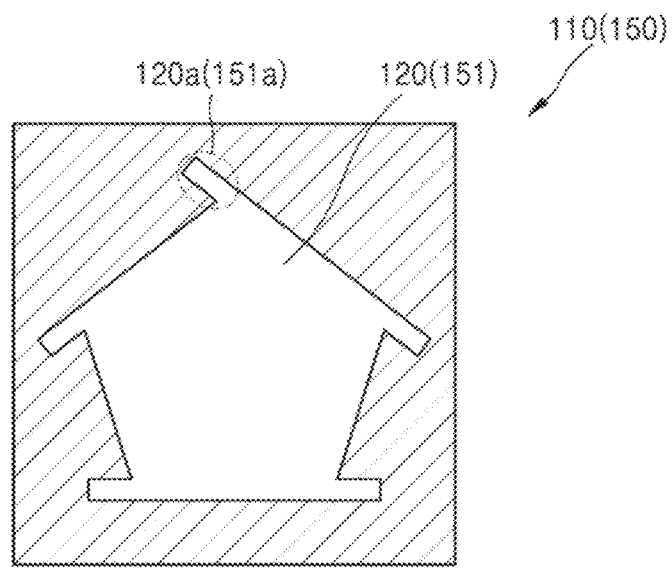

FIG. 13 is a diagram of an example of the polygonal shape. FIGS. 14A and 14B are diagrams of examples of an opening pattern 151 of a mask 150 applied to form a vertical structure 120 having a polygonal shape, and the vertical structure 120 on a substrate 110, which is formed by a dry etching process to have a shape corresponding to a shape of the opening pattern 151 of the mask 150.

Referring to FIGS. 13, 14A, and 14B, when the vertical structure 120 having the polygonal shape is to be formed on the substrate 110, in order to form the vertical structure 120 having the polygonal shape without a tail in a corner area, the opening pattern 151 of the mask 150 may have a polygonal shape, and a compensation pattern 151a, for example, a concave compensation pattern 151a, may be formed at one or more vertexes of the polygonal shape of the opening pattern 151.

FIGS. 14A and 14B illustrate examples in which the opening pattern 151 of the mask 150 and the vertical structure 120 on the substrate 110 are formed to have pentagonal shapes or deformed pentagonal shapes. However, example embodiments are not limited thereto, and the opening pattern 151 of the mask 150 and the vertical structure 120 on the substrate 110 may have hexagonal shapes or polygonal shapes with more than six sides.

As illustrated in FIGS. 14A and 14B, by applying the mask 150 including the opening pattern 151, in which the compensation pattern 151a is formed in a corner area of the opening pattern 151, that is, in the polygonal-shaped vertex of the opening pattern 151, the vertical structure 120 may be formed on the substrate 110 to have a shape corresponding to a shape of the opening pattern 151 of the mask 150. In this case, while the vertical structure 120 may have the polygonal shape or the deformed polygonal shapes, a linear side wall (e.g., a flat side wall) may be formed at a vertex of the polygonal shape.

As exemplarily illustrated in FIGS. 14A and 14B, in a case in which the vertical structure 120 having the polygonal shape is to be formed, an indented direction of the compensation pattern 151a in the corner area of the opening pattern 151 of the mask 150 and an extension direction of an indented structure 120a of the vertical structure 120 formed on the substrate 110 may vary while the indented structure 120a is formed to correspond to the indented direction of the compensation pattern 151a. Also, the number and locations of corner areas in which the compensation pattern 151a is formed may vary according to the vertical structure 120 to be formed.

As another example, the opening pattern 51 of the mask 50 and the vertical structure 20 each may have a shape including a plurality of steps.

Figure 15:
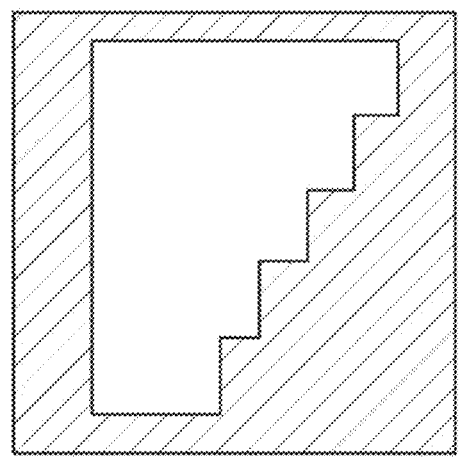
FIG. 15 is a diagram of an example of a shape including plurality of steps at a side of a vertical structure.
Figure 16A:
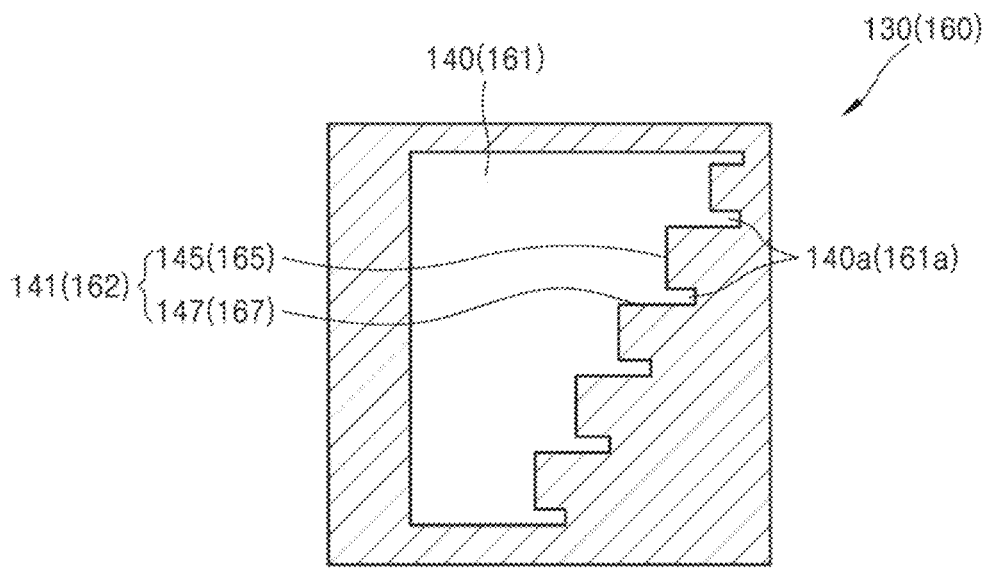
FIGS. 16A and 16B are diagrams of examples of an opening pattern of a mask applied to form a vertical structure having a shape including a plurality of steps, and the vertical structure of a substrate formed by a dry etching process to have a shape corresponding to a shape of the opening pattern of the mask.
Figure 16B:
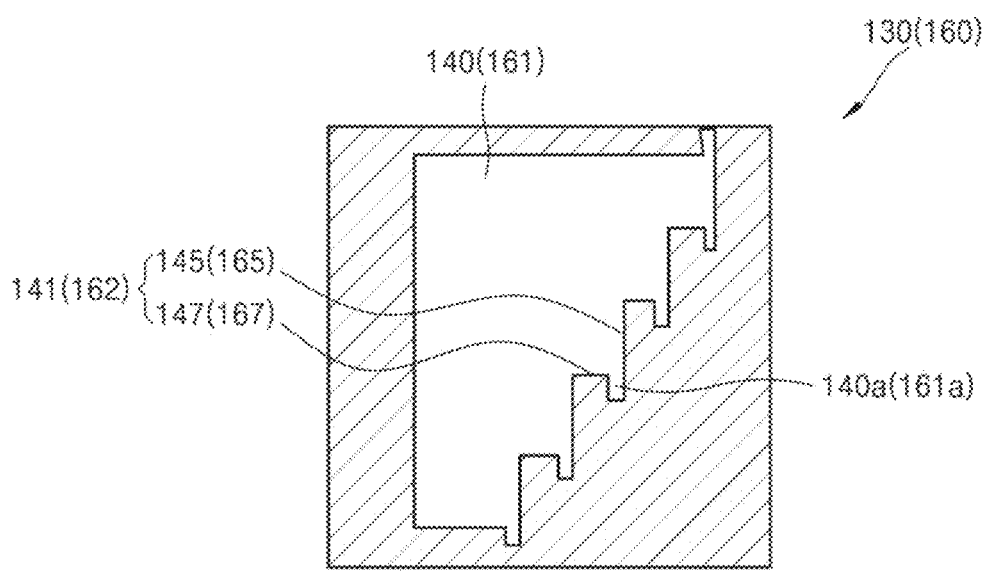

FIG. 15 is a diagram of an example of the shape including a plurality of steps at a side of a vertical structure. FIGS. 16A and 16B are diagrams of examples of an opening pattern 161 of a mask 160 applied to form a vertical structure 140 having a shape including a plurality of steps 141 at at least one side of the vertical structure 140, and the vertical structure 140 on a substrate 130, which is formed by a dry etching process to have a shape corresponding to a shape of the opening pattern 161 of the mask 160.

Referring to FIGS. 15, 16A, and 16B, when the vertical structure 140 is to be formed to have the plurality of steps 141 without a tail in a corner area, in which a raised portion 145 and a step portion 147 of the plurality of steps 141 meet each other, the opening pattern 161 of the mask 160 may have a shape including a plurality of steps 162 at one or more sides of the opening pattern 161, and a compensation pattern 161a, for example, a concave compensation pattern 161a, may be formed at one or more corner areas of the plurality of steps 162. The concave compensation pattern 161a may be formed to be indented by extending from a step portion 167 or a raised portion 165 with respect to at least one of the plurality of steps 162.

FIGS. 16A and 16B illustrate an example in which the opening pattern 161 of the mask 160 and the vertical structure 140 of the substrate 130 are formed to have the plurality of steps 162 and 141 at a side. However, example embodiments are not limited thereto. The plurality of steps 162 and 141 may further be formed at other side.

As illustrated in FIGS. 16A and 16B, by applying the mask 160 including the opening pattern 161 having the shape including the plurality of steps 162 having the compensation pattern 161a being formed to be indented in each corner area in which the raised portion 165 and the step portion 167 meet each other, the vertical structure 140 having a shape corresponding to a shape of the opening pattern 161 of the mask 160 may be formed on the substrate 130.

Here, as illustrated in FIG. 16A, the compensation pattern 161a may extend from the step portion 167 to be indented from the raised portion 165 that is immediately adjacent to the step portion 167. Also, as illustrated in FIG. 16B, the compensation pattern 161a may extend from the raised portion 165 to be indented from the step portion 167 that is immediately adjacent to the raised portion 165.

Here, FIGS. 16A and 16B illustrate that, in the opening pattern 161 having the shape including the plurality of steps 162, the compensation pattern 161a is formed in all corner areas, in which the raised portion 165 and the step portion 167 meet each other. However, it is an example, and the example embodiments of the present disclosure are not limited thereto. The compensation pattern 161a may be formed in at least one of the plurality of corner areas in the shape including the plurality of steps 162, wherein the raised portion 165 and the step portion 167 meet each other. The number and locations of corner areas in which the compensation pattern 161a is formed may be variously changed. That is, the number and locations of corner areas in which the compensation pattern 161a is formed may vary according to the vertical structure 140 to be formed.

As illustrated in FIGS. 16A and 16B, in the opening pattern 161 of the mask 160 of the shape including the plurality of steps 162 at one or more sides, the step portion 167 and the raised portion 165 of the plurality of steps 162, the step portion 167 and the raised portion 165 being adjacent to each other, may correspond to the first and second sides 25 and 27 forming an angle in the opening pattern 51 of FIG. 3. Hereinafter, for convenience, reference numerals are indicated with reference to FIG. 3. The opening pattern 161 of the mask 160 applied when forming the vertical structure 20 by the etching process according to an example embodiment may have the shapes of FIGS. 14A and 14B and 16A and 16B, instead of the shape of FIG. 3. Also, the opening pattern 161 may have various other shapes according to a shape of the vertical structure 20 that is to be formed.

As exemplarily illustrated in FIGS. 3, 14A and 14B, and 16A and 16B, the opening pattern 51 of the mask 50 applied to the etching process according to an example embodiment may have various shapes in which at least two sides form an angle. Also, according to the etching method for forming the vertical structure 20 according to an example embodiment, the mask 50 having the opening pattern 51 of various shapes in which the concave compensation pattern 51a is formed in corner areas in which at least two sides meet each other, may be used to perform a dry etching process to form the vertical structure 20 on the substrate 10 to have the shape corresponding to the shape of the opening pattern 51 of the mask 50. That is, the overall shape of the vertical structure 20 may correspond to the opening pattern 51 of the mask 50, and the vertical structure 20 may be formed to have the indented structure 20a corresponding to the compensation pattern 51a indented in the corner area of the opening pattern 51 of the mask 50 in a corner area.

As described above, the opening pattern 51 of the mask 50 may have various shapes in which at least two sides form an angle, and the opening pattern 51 may have the concave compensation pattern 51a in the corner area thereof, in which the at least two sides meet each other.

When the vertical structure 20 is formed on the substrate 10 by applying the mask 50 having the opening pattern 51 described above, the vertical structure 20 of various shapes, which has the first and second side walls 25 and 27 that are neatly linear-shaped without a tail, may be formed.

That is, in the mask 50 applied to the etching method according to an example embodiment, the opening pattern 51 may be formed by subtracting the compensation pattern 51a at at least one corner area of the opening pattern 51 in addition to a target pattern, for example, a pattern of a square shape, a polygonal shape as illustrated in FIG. 13, or a shape including a plurality of steps at at least one side as illustrated in FIG. 15. Also, the vertical structure 20 formed on the substrate 10 by the dry etching process, in which the mask 50 described above is applied, may have at least two side walls, that is, the first and second side walls 25 and 27, respectively corresponding to the at least two sides of the opening pattern 51 of the mask 50, and the vertical structure 20 may also have the indented structure 20a in a corner area of the side walls corresponding to the compensation pattern 51a of the mask 50.

Here, the indented structure 20a may correspond to an extension of the vertical structure 20 and may be formed along one of the two side walls 25 and 27 adjacent to each other to be indented with respect to the other.

Thus, by applying the etching method for forming the vertical structure 20 according to an example embodiment, the vertical structure 20 having the side walls 25 and 27 of nearly straight line without a tail may be formed in at least one corner area. Thus, when the vertical structure 20 may be formed on the substrate 10 by applying the etching method for forming the vertical structure 20 according to an example embodiment, a round corner, which may be formed because of a tail remaining in the corner area during general dry etching, may not be generated, and thus, a change of a structure dimension around the side walls of the vertical structure 20 may be prevented, so that an output of a device may not be affected.

Also, when the etching method for forming the vertical structure 20 according to an example embodiment is applied, even when a device having the floating structure 100 is manufactured, there may be no tail in a corner area, and thus, a change in vibration frequency may not occur, and an additional space for securing a distance between side walls may not be required for the prevention of the effect of the tail remaining in the corner area. Furthermore, an increase in die size and a decrease in die density in a wafer may be prevented.

Figure 5:
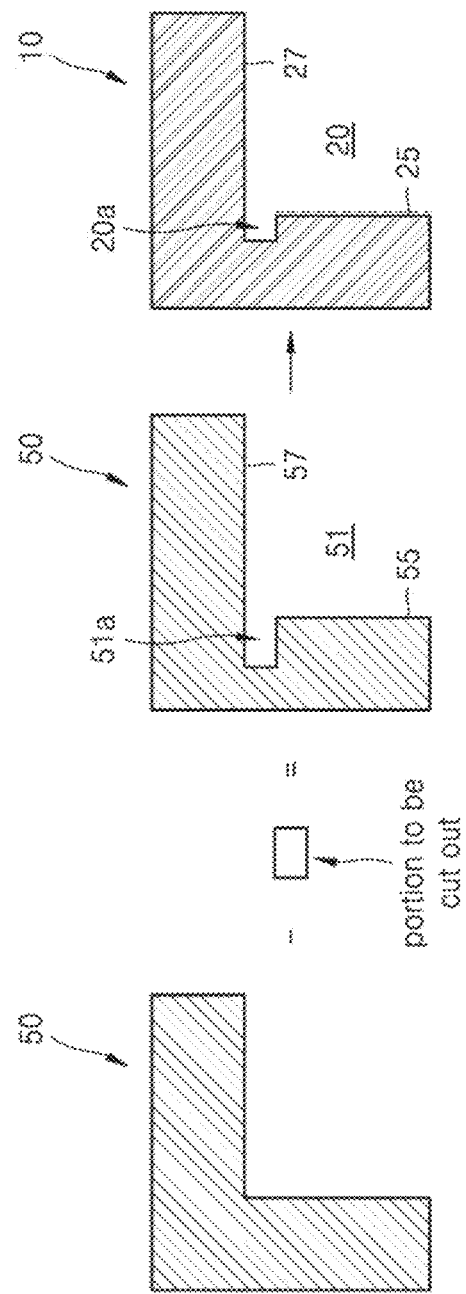
FIG. 5 is a schematic diagram of a relationship of an opening pattern of a mask, according to an etching method for forming a vertical structure, and the vertical structure formed according to the etching method and having an indented structure in a corner area.

FIG. 5 is a schematic diagram of a relationship between the opening pattern 51 of the mask 50 according to the etching method for forming the vertical structure 20 according to an example embodiment, and the vertical structure 20 formed to have the indented structure 20a at a corner area by the opening pattern 51 of the mask 50.

As illustrated in FIG. 5, according to the etching method for forming the vertical structure 20 according to an example embodiment, the opening pattern 51 of the mask 50 applied to the etching process corresponds to a recess formed by subtracting a portion from an inner corner of the mask 50 to form the compensation pattern 51a at the inner corner at the two sides 55 and 57 meet each other, and the vertical structure 20 may be formed on the substrate 10 such that the vertical structure 20 has the shape corresponding to the shape of the opening pattern 51. Due to the compensation pattern 51a, no tail may not remain at the corner of the two side walls 25 and 27, and the side walls 25 and 27 of the vertical structure 20 may form a clean straight line.

Figure 6A:
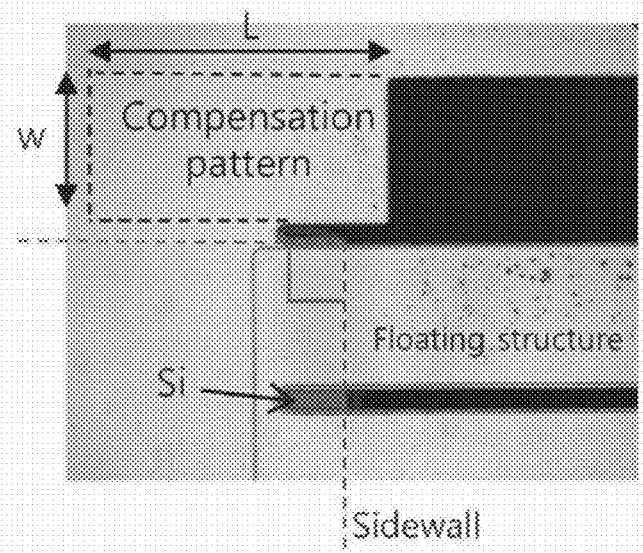
Figure 6B:
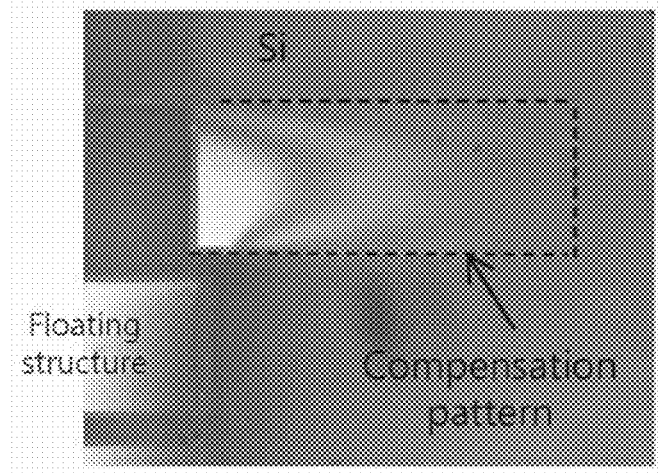

FIGS. 6A through 6C are diagrams of a sample of the vertical structure 20 formed by applying the etching method for forming the vertical structure 20 according to an example embodiment, wherein FIG. 6A is a schematic top view image, FIG. 6B is a schematic bottom view image, and FIG. 6C is a schematic rear three-dimensional image. As illustrated in FIG. 6C, a beam array forming a floating structure may be arranged at the location of the vertical structure 20 formed by the etching process with respect to the side wall.

Referring to FIGS. 6A through 6C, when a vertical structure is formed on a silicon (Si) substrate by dry etching, a floating structure may be arranged at the location of the vertical structure formed by the etching process with respect to a side wall, and an indented structure may be formed at the location indicated as a compensation pattern to correspond to the compensation pattern, so that there may be no tail remaining in a corner area. Accordingly, an additional space between the floating structure and an opposite side wall may not be required, in order to arrange the floating structure.

Figure 7:
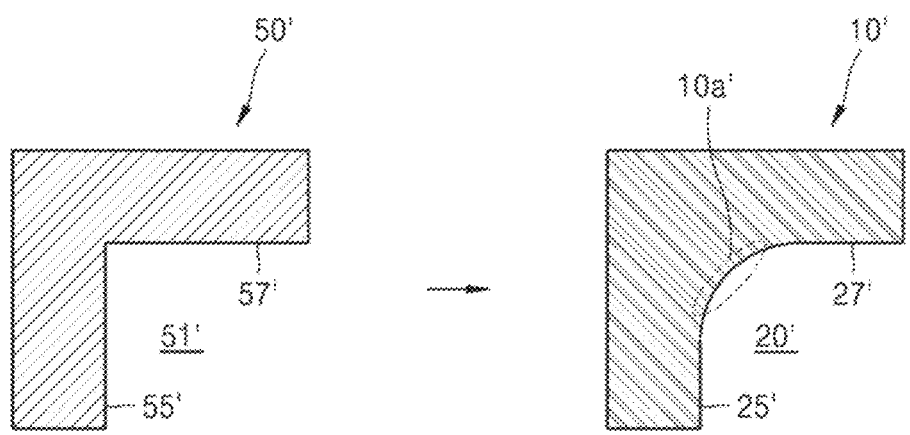
FIG. 7 is a schematic diagram of a relationship of an opening pattern of a mask according to an etching method of a comparative example, and a vertical structure formed according to the opening pattern of the mask and having a rounded corner area.

FIG. 7 is a schematic diagram of a relationship of an opening pattern 51' of a mask 50' according to an etching method of a comparative example, and a vertical structure 20' formed according to the opening pattern 51' and having a round corner area.

As illustrated in FIG. 7, according to the comparative example, when the opening pattern 51' of the mask 50' applied to the etching process is formed such that a corner area of the opening pattern 51', in which two sides 55' and 57' meet each other, forms a right angle, the vertical structure 20' having a shape corresponding to the shape of the opening pattern 51' may be formed on a substrate 10', but there may be a tail 10a' because a corner area of the vertical structure 20', in which first and second side walls 25' and 27' meet each other, has a round shape.

Figure 8:
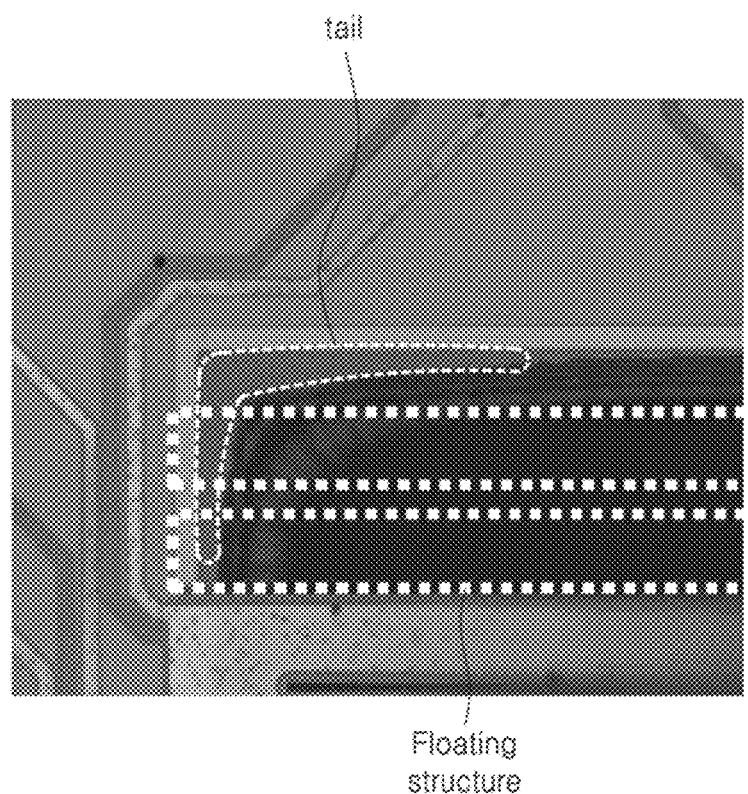
FIG. 8 is a top view image of a sample of a comparative example, in which a vertical structure is formed according to an etching method of a comparative example.

FIG. 8 is a top view image of a sample of the vertical structure 20' formed according to an etching method of a comparative example.

Referring to FIG. 8, when the vertical structure 20' is formed by etching, there may be a tail in the corner area of the vertical structure 20', in which two side walls meet each other. A square box indicated by dashed lines in FIG. 8 may indicate a location of a floating structure.

Figure 9A:
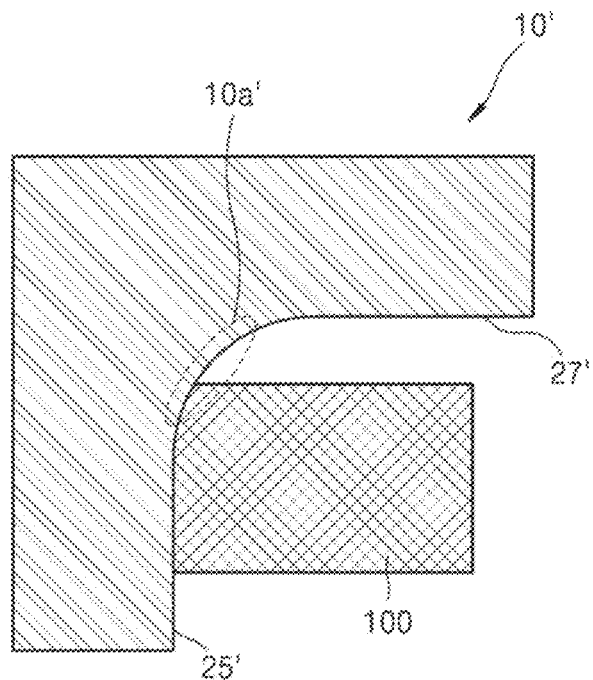
FIGS. 9A and 9B are respectively a schematic plan view and a schematic front view of a structure having a tail remaining in a corner area, when a vertical structure is formed on a substrate by applying an etching method of a comparative example.
Figure 9B:
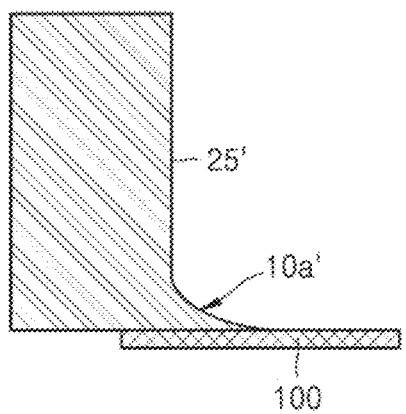

FIGS. 9A and 9B are a schematic plan view and a schematic front view a structure in which a tail remains in the corner area, when the vertical structure 20' is formed on the substrate 10' by applying an etching method of a comparative example.

As illustrated in FIGS. 9A and 9B, according to the etching method of the comparative example, there may be a tail, for example, a Si tail, in the corner area in which the first side wall 25' and the second side wall 27' meet each other, and thus, the corner may have a round shape. Thus, when the floating structure 100 protrudes from the first side wall 25' toward a space of the vertical structure 20', the vibration of the floating structure 100 may not be smooth, and a vibration frequency may be changed, due to the effects of the tail, when the floating structure 100 is arranged at the same location as when the vertical structure is formed by applying the etching method according to an example embodiment.

Thus, when the vertical structure 20' is formed by the method of the comparative example, because the tail 10a' may remain in the corner area, an additional space may further be required to secure a distance between the floating structure 100 and the second side wall 27' to prevent the effects on the vibration frequency of the floating structure 100. Accordingly, when a plurality of devices are manufactured by a wafer process, a die size may be increased and die density in the wafer may be decreased.

Figure 10:
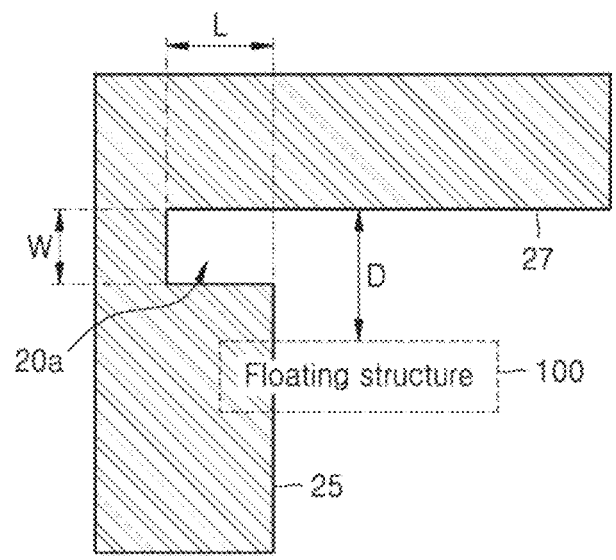
FIG. 10 is a diagram of a size of a compensation pattern and a distance relationship of a floating structure and a side wall, when an etching method for forming a vertical structure according to an example embodiment is applied.

FIG. 10 is a diagram of a size of the compensation pattern 51a and a distance relationship of the floating structure 100 and a side wall, when the etching method for forming the vertical structure 20 according to an example embodiment is applied.

Referring to FIG. 10, the compensation pattern 51a may be formed along one of the first and second sides 55 and 57 of the opening pattern 51 of the mask 50, for example, the second side 57, to be indented from the other, for example, the first side 55. Also, the vertical structure 20 may have the first and second side walls 25 and 27 corresponding to the first and second sides 55 and 57 of the mask 50.

When a width and a length of the compensation pattern 51a are W and L, respectively, and a distance between the floating structure 100 located to protrude from a side wall of the vertical structure 20 corresponding to the other side, for example, the first side 55, and the second side wall 27 of the vertical structure 20 corresponding to the side, for example, the second side 57, is D, the vertical structure 20 may be formed such that a size of the compensation pattern 51a, a distance between the floating structure 100 and the second side wall 27 satisfy any one of a first condition in which 50<W and D>200, a second condition in which 50<W<150, L≥1.3 W, and D>W, and a third condition in which 150 W, L≥W and D>W. Here, the unit of the numerical value may be a micron, a sub-micron, a millimeter, or a sub-millimeter.

When the size of the compensation pattern 51a and the distance between the floating structure 100 and the second side wall 27 are determined to satisfy any one of the first through third conditions, the indented structure 20a may be formed in the corner area so that a tail may not remain. Thus, even the floating structure 100 is arranged to protrude toward the space of the vertical structure 20, a vibration frequency of the floating structure 100 may not be changed, and an additional space for securing a distance between the floating structure 100 and the side wall may not be required. Also, when a plurality of devices are manufactured by a wafer process, a die size may be sufficiently decreased, and die density in the wafer may be sufficiently increased.

Figure 11:
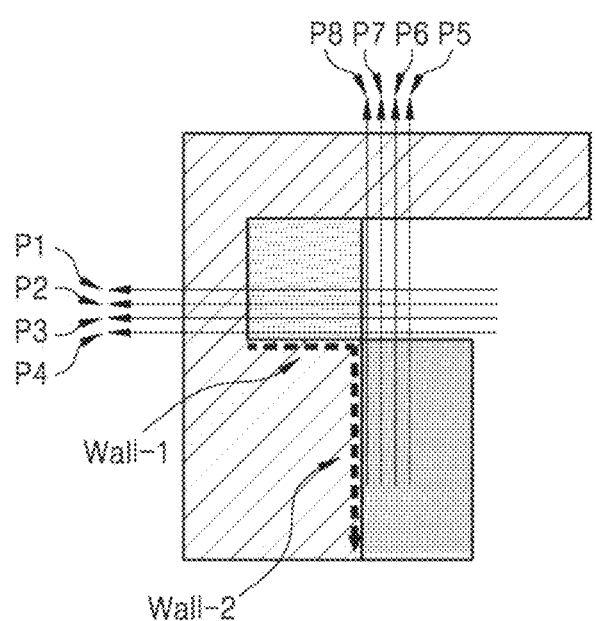
FIG. 11 is a schematic diagram of a corner area of a vertical structure formed by applying an etching process according to an example embodiment.
Figure 12:
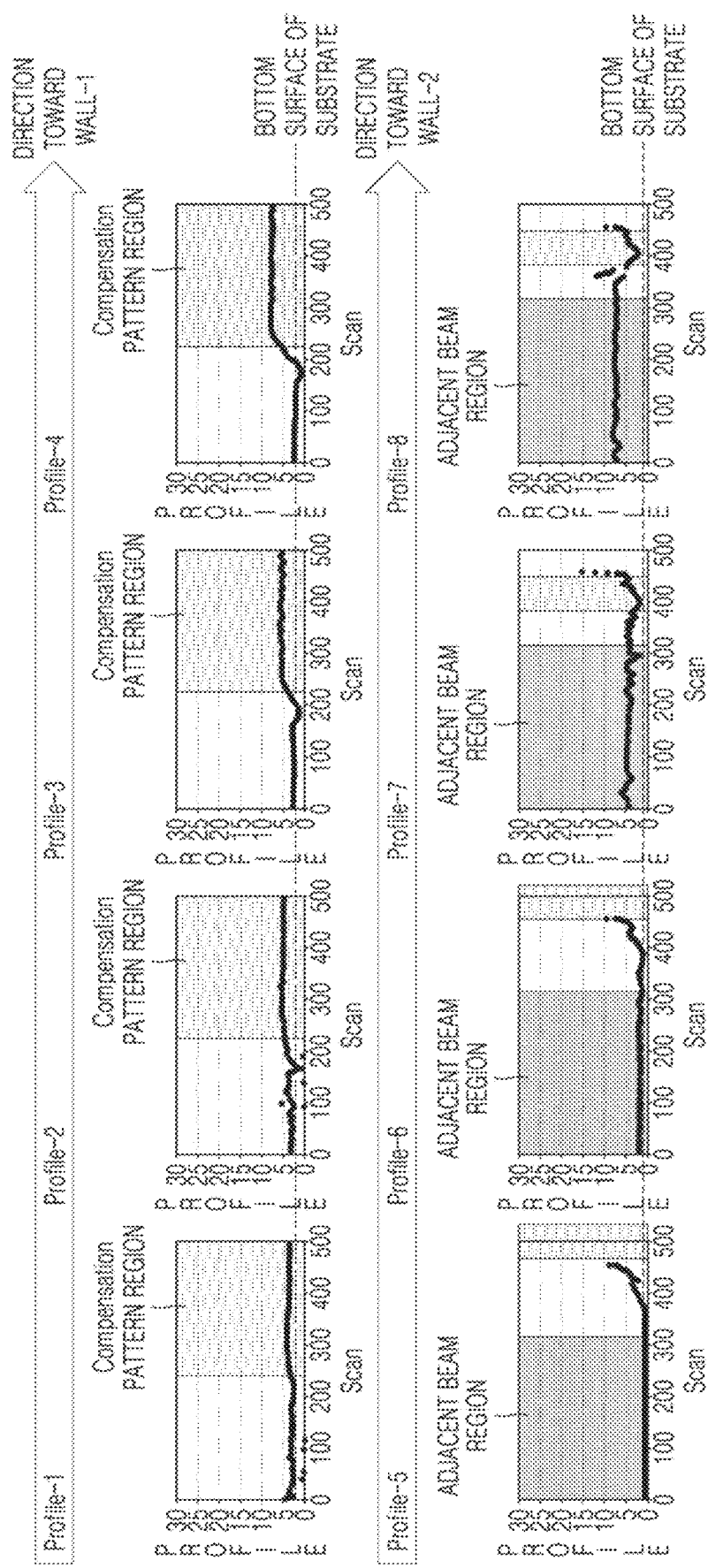
FIG. 12 is a graph of a profile scanned along lines indicated in FIG. 11.

FIG. 11 is a schematic diagram of a corner area of a vertical structure formed by applying an etching method according to an example embodiment. FIG. 12 shows graphs of profiles scanned along lines indicated in FIG. 11. The upper graphs of FIG. 12 show the profiles scanned in parallel with a side wall Wall-1 in a region of the vertical structure corresponding to a compensation pattern, and the lower graphs of FIG. 12 show the profiles scanned in parallel with a side wall Wall-2 in a region of the vertical structure, in which a floating structure is located.

The profiles scanned along scan lines P1, P2, P3, P4, P5, P6, P7, and P8 in FIG. 11 are shown in graphs Profile-1, Profile-2, Profile-3, Profile-4, Profile-5, Profile-6, Profile-7, and Profile-8 in FIG. 12.

As shown in the scanned profiles in FIG. 12, when the vertical structure is formed by applying the etching method according to an example embodiment, a tail may not remain in the corner area, and the side wall Wall-2 may be formed to have a clean straight line in the region (an adjacent beam region) in which the floating structure is located.

It is described above that the vertical structure 20 is formed on the substrate 10, for example, the Si substrate, by using the etching method according to an example embodiment. However, the vertical structure 20 may be formed on a substrate having various stack structures in which additional layers are further included on the substrate. Here, the vertical structure may be formed by etching the substrate from an opposite surface of the stack structure.

Figure 18A:
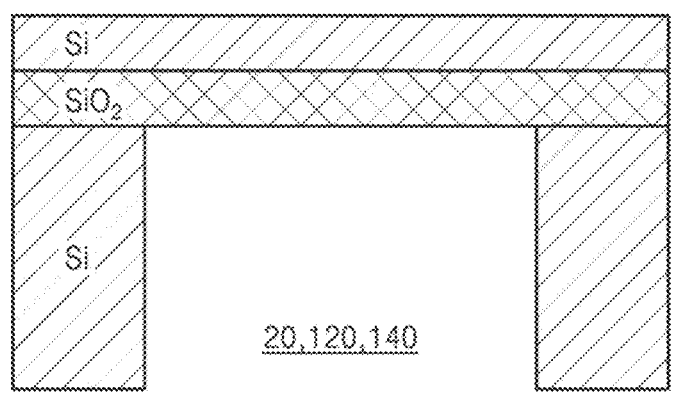
FIGS. 18A through 18C are diagrams of examples of forming a vertical structure on substrates having various stack structures by an etching method according to an example embodiment.
Figure 18B:
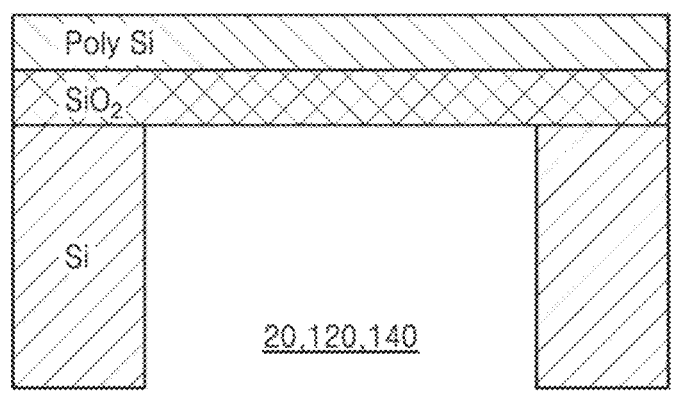
Figure 18C:
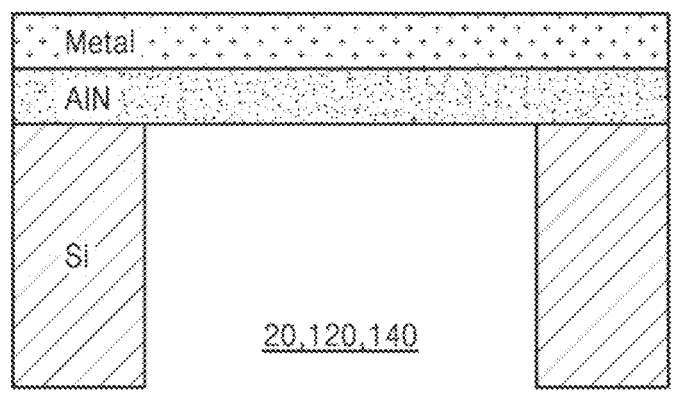

For example, with respect to the substrate having various stack structures as illustrated in FIGS. 18A through 18C, the substrate may be etched by the etching process according to an example embodiment, from the opposite surface of the stacked structures, to form the vertical structures 20, 120, and 140 on the substrate.

FIGS. 18 through 18C illustrate diagrams of examples of forming the vertical structures 20, 120, and 140 on substrates having various stack structures according to an etching method according to an example embodiment.

Referring to FIG. 18A, as additional layers, an insulating layer, for example, a SiO2 layer, may be formed on a Si substrate, and a layer having the same material as the substrate, for example, a Si layer, may be formed on the insulating layer.

Referring to FIG. 18B, an insulating layer, for example, a SiO2 layer, may be formed on the Si substrate, and a poly-Si layer may be formed on the insulating layer, as additional layers.

Referring to FIG. 18C, an AlN layer may be formed on the Si substrate, and a metal layer may be formed on the AlN layer, as additional layers.

With respect to the substrate having various stack structures as illustrated in FIGS. 18A through 18C, the vertical structure, for example, a back cavity, a through-hole, etc. may be formed on the substrate by applying the etching method according to an example embodiment. Here, the vertical structure may be formed on the substrate by the dry etching process by locating the mask having the opening pattern and further including the compensation pattern on the substrate, in a state in which the substrate having the stack structure is turned upside down such that a bottom surface is upward, for the etching process.

As described above, by applying the etching process for forming the vertical structure according to an example embodiment, the vertical structures having an interval of several microns, for example, back cavities, through-holes, etc., may be formed. Thus, when an electronic device including a floating structure, such as a membrane, a cantilever, etc., is formed, the electronic device may be manufactured with little tolerance, for example, a tolerance within 1%.

Also, when the etching process for forming the vertical structure according to an example embodiment is applied, for example, etching may be constantly performed regardless of a silicon crystallization direction, when the vertical structure is formed on the Si substrate. Also, a side wall portion having the side wall having a clean straight line may be used as an area for a bonding pad, etc.

For example, the resulting performance of a device may be determined by forming the floating structures in a form factor of a sub-millimeter, and defining a location of a fixed end of the floating structures through deep Si etching.

However, in the case of deep Si etching for forming a convex corner or a narrow Si trench, depletion may occur in ions to react, due to ions confined in an adjacent vertical side wall, and an etching reaction slows according to ion refraction due to an electrical field of the adjacent side wall, thereby occurring reactive ion etching (RIE) lag. A Si tail may remain on the adjacent side wall because of low etching reaction in polygonal vertexes.

However, according to the etching method for forming the vertical structure according to an example embodiment, for example, a compensation design may be possible, whereby a concave compensation pattern having a slit shape may be formed in an orthogonal direction of a side wall so that a Si tail may not remain on the previous vertex locations. As described above, by applying the opening pattern of the mask having a shape in which the orthogonal compensation pattern is subtracted from a target pattern so that no Si tail may be remained, the vertical structure including the side wall having a linear shape may be formed.

The etching method for forming the vertical structure 20 according to an example embodiment described above may be applied to manufacture an electronic device including various floating structures.

When the electronic device is formed by applying the etching method for forming the vertical structure described above, for example, the floating structure may be coupled to the substrate, and the vertical structure may be formed while the floating structure is coupled to the substrate. Alternatively, the floating structure may be coupled to the substrate after the vertical structure is formed. In addition, the vertical structure may include a through-hole, and the floating structure may include a support portion extending from the substrate. The support portion extending from the substrate may be formed by etching the substrate such that the through-hole is formed around the support portion of the floating structure.

Also, the etching method for forming the vertical structure 20 according to an example embodiment may be applied to manufacture electronic devices including various floating structures, for which the vertical structure 20, for example, a back cavity or a through-hole, is required to be formed. For example, the electronic devices may include a sound sensor, a pressure sensor, an inertial sensor, a timing device, and an energy harvester.

As described above, by applying the etching process for forming the vertical structure 20 according to an example embodiment, the electronic device including the floating structure 100 located in the vertical structure 20 formed by the etching process may be manufactured.

For example, by applying the etching process for forming the vertical structure 20 according to an example embodiment, sensors including, for example, a sound sensor or a vibration sensor as illustrated in FIGS. 19 through 22 may be manufactured.

Figure 19:
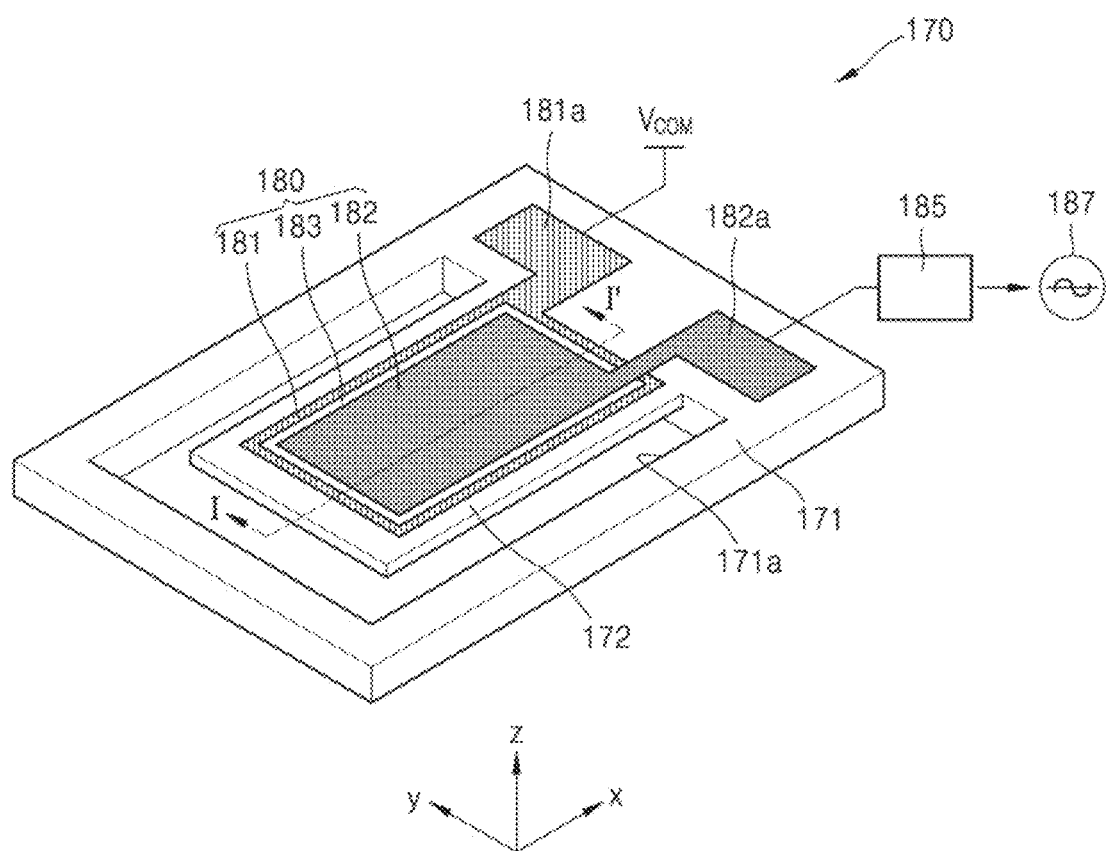
FIG. 19 is a perspective view of an example of a sensor manufactured by applying an etching process for forming a vertical structure, according to an example embodiment.
Figure 20:
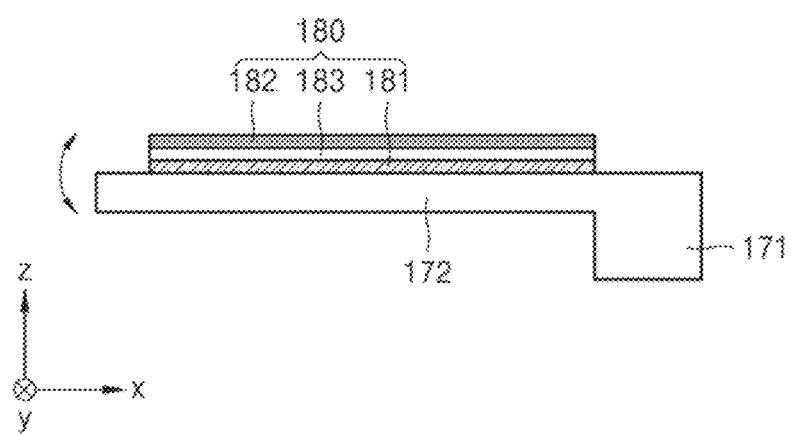
FIG. 20 is a cross-sectional view of a sensor, taken along line I-I' of FIG. 19.

FIG. 19 is a perspective view of an example of a sensor 170 manufactured by applying an etching process for forming a vertical structure, according to an example embodiment. FIG. 20 is a cross-sectional view of the sensor 170, taken along line I-I' of FIG. 19.

Referring to FIGS. 19 and 20, the sensor 170 may include a sensor element 180 provided on a substrate 171. An open space 171a may be formed through the substrate 171. A support portion 172 may be provided to extend from the substrate 171 toward the open space 171a. Here, the open space 171a may be formed by applying the etching process for forming the vertical structure according to an example embodiment.

The support portion 172 may have an end fixed on the substrate 171 and the other end provided to be movable in upper and lower directions (for example, a z-axis direction). The substrate 171 may include, for example, a Si substrate. However, the substrate 171 is not limited thereto and may include various materials.

The sensor element 180 may be provided on the support portion 172. In detail, the sensor element 180 may include a first electrode 181 provided on a surface of the support portion 172, a piezoelectric layer 183 provided on the first electrode 181, and a second electrode 182 provided on the piezoelectric layer 183. First and second terminals 181a and 182a may be provided on the substrate 171 to be electrically connected with the first and second electrodes 181 and 182.

When external energy, such as sound or pressure, is input into the sensor element 180, the piezoelectric layer 183 may be transformed to generate electrical energy. For example, when the sound generated from a sound source S is input into the sensor element 180, such that the piezoelectric layer 183 is transformed, electrical energy may occur between the first and second electrodes 181 and 182, and the electrical energy may be output through the first and second terminals 181a and 182a. Here, when a common voltage $V_{com}$ is applied to the first terminal 181a, an output signal 187 may be obtained through a readout circuit 185 connected to the second terminal 182a.

The sensor 170 illustrated in FIG. 19 may correspond to a sensor having a cantilever structure, and may have an output gain varying according to an input direction of external energy. That is, the sensor 170 may operate as a directional sound sensor having a sensitivity varying based on the input direction of the external energy, or as a vibration sensor. FIG. 19 illustrates an example in which the sensor includes one sensing device. However, a plurality of sensing devices may be arranged in the sensor.

Figure 21:
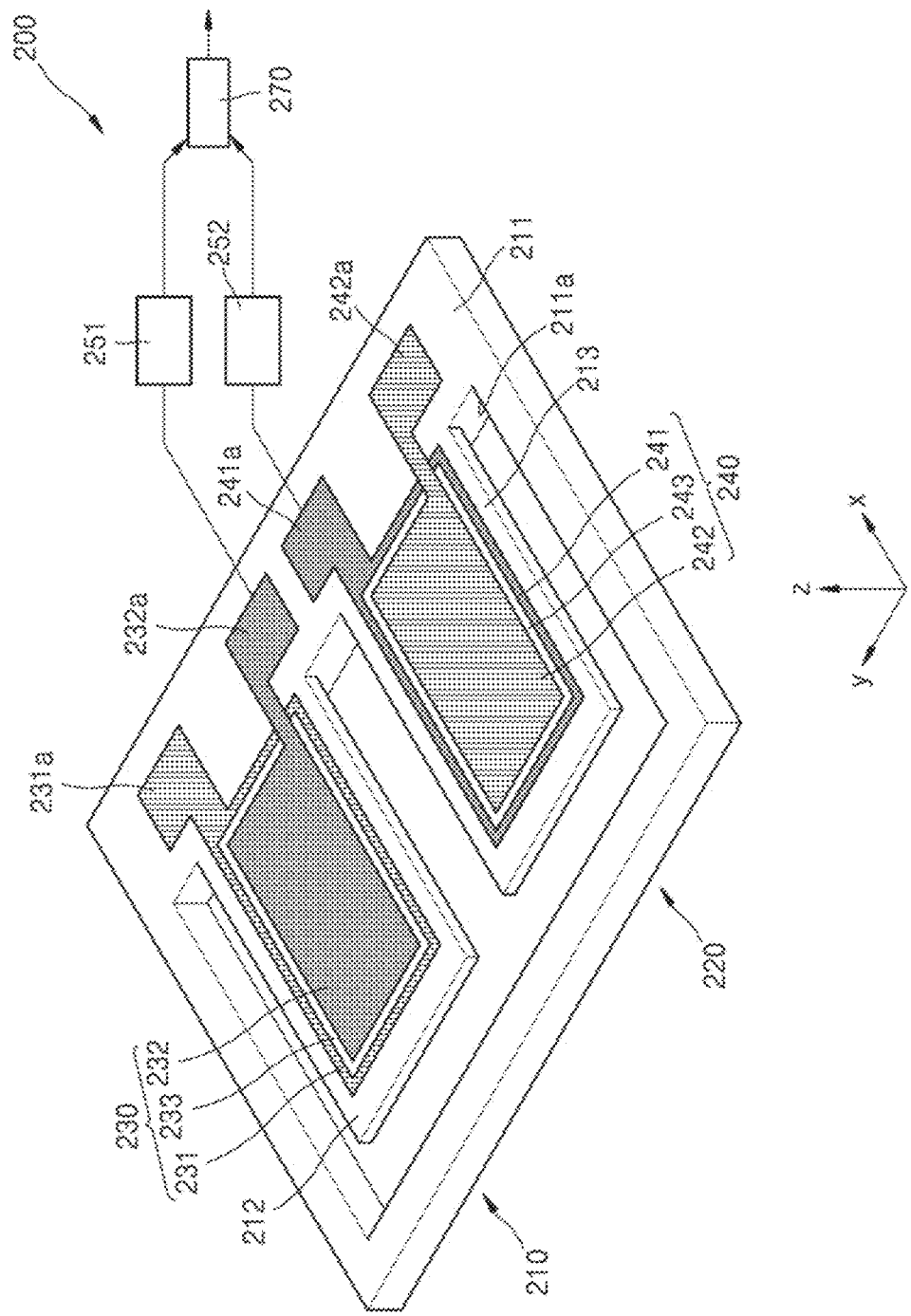
FIGS. 21 and 22 are perspective views of examples of sensors according to embodiments, the sensors being manufactured by applying an etching process for forming a vertical structure, according to an example embodiment.

FIG. 21 is a perspective view of another example of a sensor 200 manufactured by applying the etching process for forming the vertical structure 20, according to an example embodiment.

Referring to FIG. 21, the sensor 200 may include a first sensing device 210 and a second sensing device 220 on the same plane and a signal processor 270 configured to process signals output from the first and second sensing devices 210 and 220. The first and second sensing devices 210 and 220 may be arranged to operate in synchronization with respect to an input of external energy.

An open space 211a may be formed through a substrate 211. First and second support portions 212 and 213 may extend from the substrate 211 toward the open space 211a. The first sensing device 210 may be provided on the first support portion 212 and the second sensing device 220 may be provided on the second support portion 213. Here, the open space 211a may be formed by applying the etching process for forming the vertical structure according to an example embodiment.

The first sensing device 210 may include a first sensor element 230. The first sensor element 230 may include a first electrode 231 provided on an upper surface of the first support portion 212, a first piezoelectric layer 233 provided on the first electrode 231, and a second electrode 232 provided on the first piezoelectric layer 233. First and second terminals 231a and 232a may be provided on one side of an upper surface of the substrate 211 to be electrically connected with the first and second electrodes 231 and 232.

The second sensing device 220 may include a second sensor element 240. The second sensor element 240 may include a third electrode 241 provided on an upper surface of the second support portion 213, a second piezoelectric layer 243 provided on the third electrode 241, and a fourth electrode 242 provided on the second piezoelectric layer 243. Here, the third electrode 241 may have the same polarity as the second electrode 232, and the fourth electrode 242 may have the same polarity as the first electrode 231. Third and fourth terminals 241a and 242a may be provided on other side of upper surface of the substrate 211 to be electrically connected with the third and fourth electrodes 241 and 242.

When external energy, such as sound or pressure, is input into the first sensor element 230, the first piezoelectric layer 233 may be transformed to generate electrical energy. For example, when the sound generated from a sound source S is input into the first sensor element 230, such that the first piezoelectric layer 233 is transformed, electrical energy may occur between the first and second electrodes 231 and 232, and the electrical energy may be output through the first and second terminals 231a and 232a. Here, for example, when a common voltage $V_{com}$ is applied to the first terminal 231a, an output signal may be obtained through a readout circuit 251 connected to the second terminal 232a.

When external energy, such as sound or pressure, is input into the second sensor element 240, the second piezoelectric layer 243 may be transformed to generate electrical energy. For example, when the sound generated from the sound source S is input into the second sensor element 240, such that the second piezoelectric layer 243 is transformed, electrical energy may occur between the third and fourth electrodes 241 and 242, and the electrical energy may be output through the third and fourth terminals 241a and 242a. Here, for example, when a common voltage $V_{com}$ is applied to the fourth terminal 242a, an output signal may be obtained through a readout circuit 252 connected to the third terminal 241a.

Figure 22:
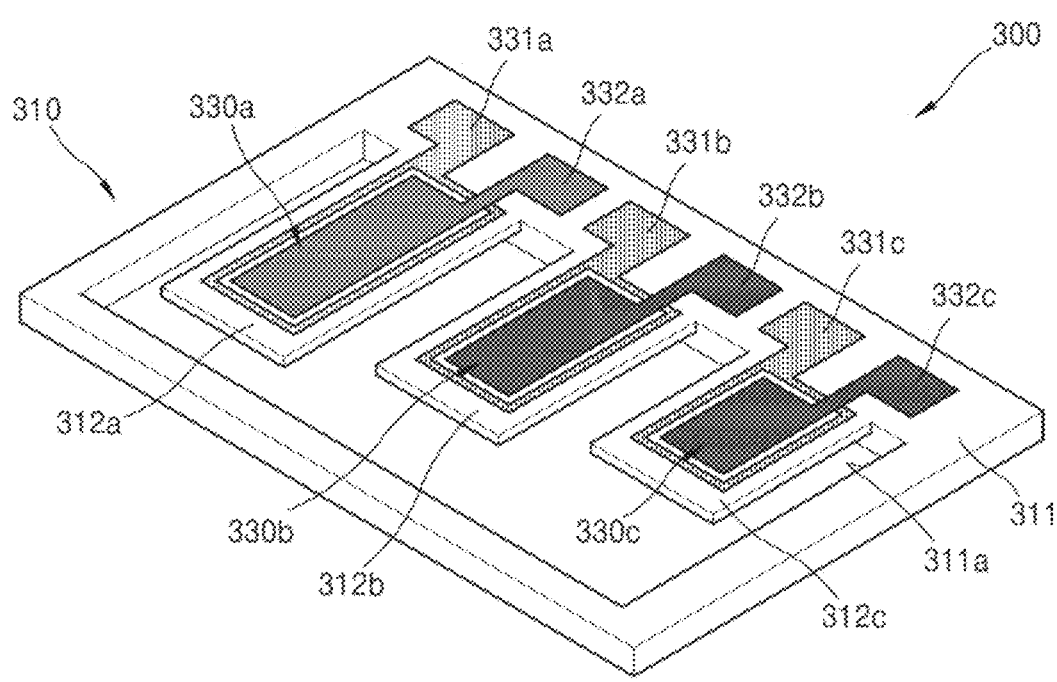

FIG. 22 is a perspective view of another example of a sensor 300 manufactured by applying the etching process for forming the vertical structure 20, according to an example embodiment.

Referring to FIG. 22, the sensor 300 may include a plurality of sensing devices 330a, 330b, and 330c. An open space 311a may be formed through a substrate 311, and a plurality of support portions 312a, 312b, and 312c may be provided to extend from the substrate 311 toward the open space 311a. Here, the open space 311a may be formed by applying the etching process for forming the vertical structure according to an example embodiment.

The plurality of sensing devices 330a, 330b, and 330c may have different central frequencies from one another. To this end, the plurality of sensing devices 330a, 330b, and 330c may be provided to have different dimensions from one another. For example, the plurality of sensing devices 330a, 330b, and 330c may have at least one of different lengths, different widths, and different thicknesses. FIG. 22 illustrates that the plurality of support portions 312a, 312b, and 312c having different lengths from one another are provided on the substrate 311 and the plurality of sensing devices 330a, 330b, and 330c having different lengths from one another are provided on the plurality of support portions 312a, 312b, and 312c. FIG. 22 illustrates three sensing devices 330a, 330b, and 330c having first through third central frequencies. However, it is only an example. The number of sensing devices having different central frequencies from one another may be variously changed.

Each of the plurality of sensing devices 330a, 330b, and 330c may be substantially the same as the sensor 170 illustrated in FIG. 19. In detail, the sensing element of each of the plurality of sensing devices 330a, 330b, and 330c may include a first electrode provided on an upper surface of each of the plurality of support portions 312a, 312b, and 312c, a piezoelectric layer provided on the first electrode, and a second electrode provided on the first piezoelectric layer. Here, the first and second electrodes may, for example, correspond to a positive (+) electrode and a negative (−) electrode. However, it is not limited thereto.

A plurality of first terminals 331a, 331b, and 331c electrically connected to the plurality of first electrodes and a plurality of second terminals 332a, 332b, and 332c electrically connected to the plurality of second electrodes may be provided on an upper surface of the substrate 311.

Each of the sensing devices 330a, 330b, and 330c may be arranged to operate in synchronization with respect to an input of external energy.

When sound is input into the sensing devices 330a, 330b, and 330c, the piezoelectric layers may be transformed to generate electrical energy between the first and second electrodes, and the electrical energy may be output through readout circuits as a plurality of output signals having different central frequencies.

FIGS. 23 through 28 are diagrams of various electronic devices in which the sensors 170, 200, and 300 are applied as sound sensors.

Figure 23:
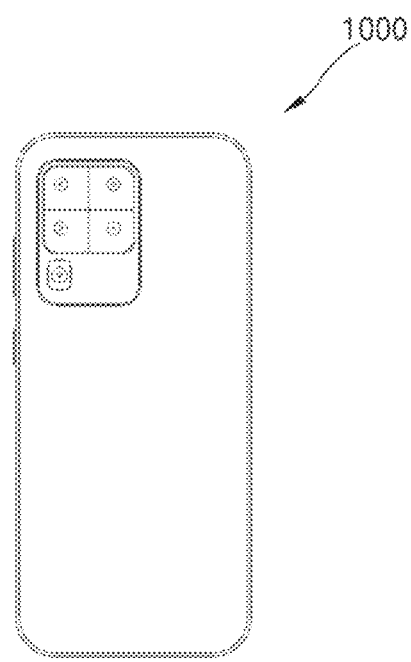
FIGS. 23 through 28 are diagrams of various examples of electronic devices in which sensors according to various example embodiments are applied.
Figure 24:
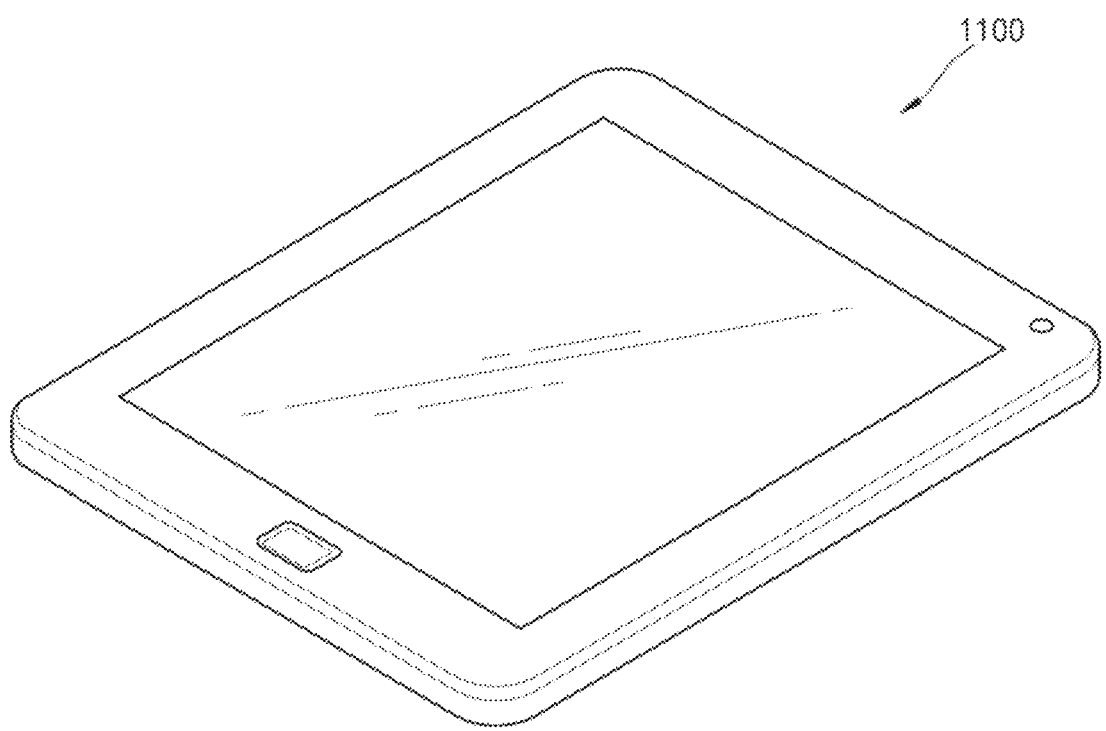
Figure 25:
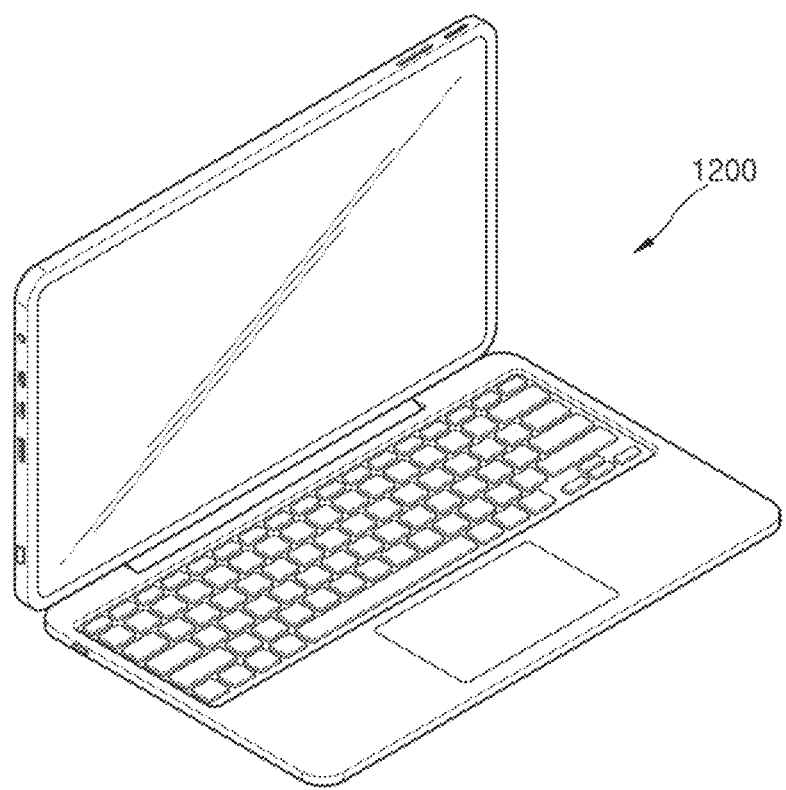
Figure 26:
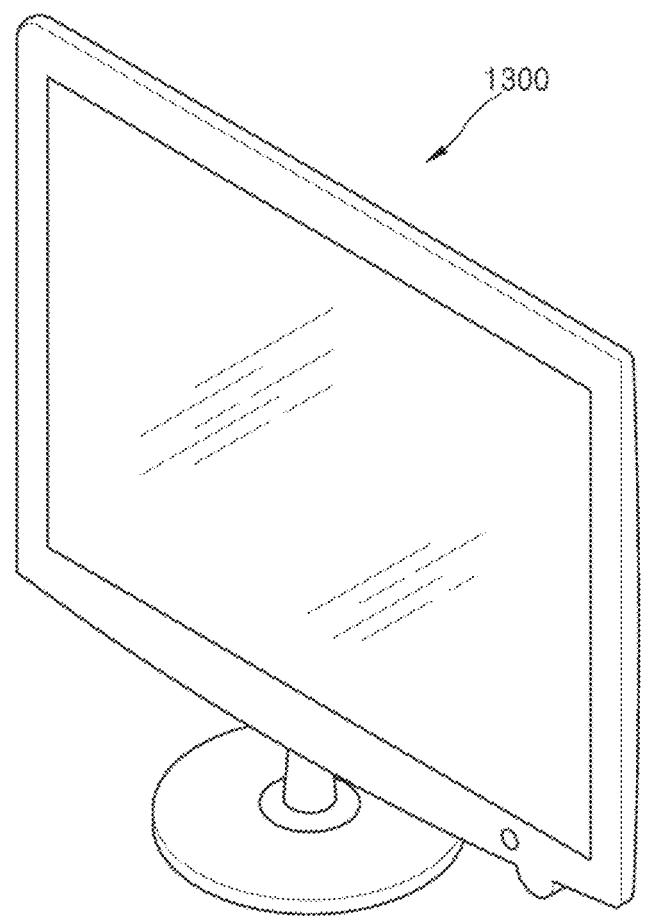
Figure 27:
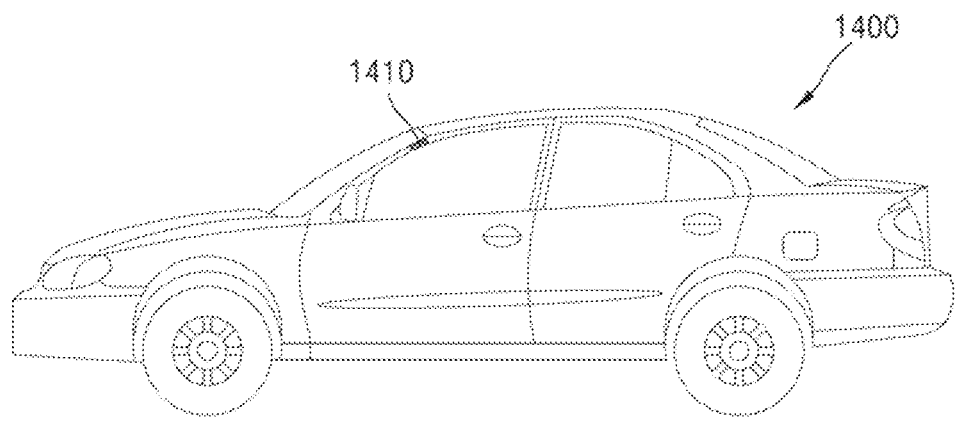
Figure 28:
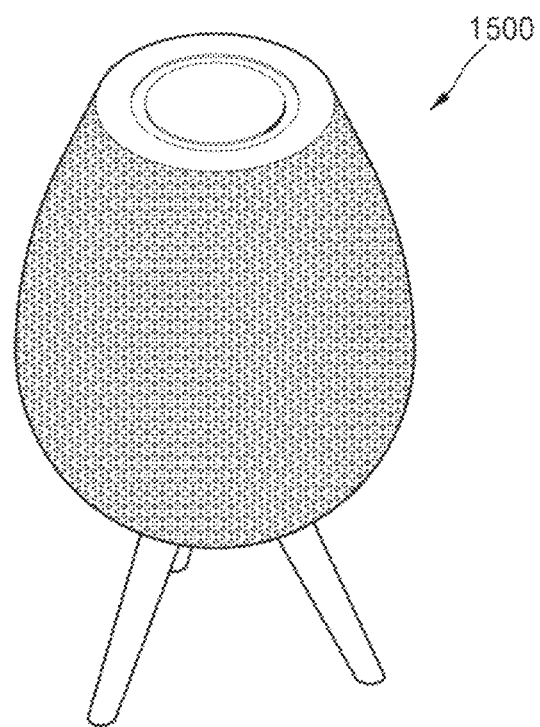

The sensors 170, 200, and 300 according to the example embodiments may correspond to sound sensors, and the sensors 170, 200, and 300 may be applied to various electronic devices, such as a mobile phone or a smart phone 1000 illustrated in FIG. 23, a tablet or a smart tablet 1100 illustrated in FIG. 24, a notebook computer 1200 illustrated in FIG. 25, a television or a smart television 1300 illustrated in FIG. 26, an embedded microphone 1410 in a vehicle 1400 having high vibration illustrated in FIG. 27, and an artificial intelligence (AI) speaker 1500 illustrated in FIG. 28. For example, the smartphone 1000 or the smart tablet 1100 may include a plurality of high resolution cameras each including a high resolution image sensor. The plurality of high resolution cameras may be used to extract depth information of objects in an image, adjust out-focusing of an image, or automatically identify objects in an image.

The sensors 170, 200, and 300 according to the example embodiments, which are formed by forming the open spaces by applying the etching process for forming the vertical structure according to an example embodiment, and the electronic devices including the sensors 170, 200, and 300 are described with reference to the accompanying drawings. However, it will be understood by one of ordinary skill in the art that the descriptions are examples and various modifications and equivalent example embodiments may be possible from the descriptions. Thus, the example embodiments described above should be considered in a descriptive sense only and not for purposes of limitation.

According to the etching method for forming the vertical structure according to an example embodiment, the vertical structure having the side wall having the clean line shape, without a tail in the corner area in which the two side walls meet each other, may be formed.

Thus, when an electronic device including a floating structure, such as a cantilever, etc., protruding from a side wall toward a space of a vertical structure, is manufactured by applying the etching method for forming the vertical structure according to an example embodiment, a tail may not remain in a corner area. Thus, a vibration frequency of the floating structure may not be changed, and an additional space for securing a distance between the floating structure and an adjacent side wall may not be required. Thus, when a plurality of devices are manufactured by a wafer process, a die size may be sufficiently decreased, and die density in the wafer may be sufficiently increased.

The foregoing example embodiments are merely exemplary and are not to be construed as limiting. The present teaching can be readily applied to other types of apparatuses. Also, the description of the example embodiments is intended to be illustrative, and not to limit the scope of the claims, and many alternatives, modifications, and variations will be apparent to those skilled in the art.

What is claimed is:

1. An etching method for forming a vertical structure, the etching method comprising:
    positioning a mask on a substrate, an opening pattern of the mask comprising a compensation pattern that is disposed at a corner of the opening pattern and is indented from the corner of the opening pattern towards an outer boundary of the mask; and
    forming the vertical structure on the substrate through the opening pattern of the mask by a dry etching process.

2. The etching method of claim 1, wherein the opening pattern is formed in the mask, in a shape in which the compensation pattern is subtracted from a target pattern.

3. The etching method of claim 1, wherein the compensation pattern is positioned at two adjacent sides of the opening pattern, wherein the vertical structure formed on the substrate by the dry etching process comprises:
    a first side wall and a second side wall respectively corresponding to the two adjacent sides of the opening pattern of the mask; and
    an indented structure formed at a corner of the first side wall and the second side wall corresponding to the compensation pattern of the mask.

4. The etching method of claim 3, wherein the indented structure corresponds to an extension of the vertical structure.

5. The etching method of claim 3, wherein the indented structure is formed along the first side wall to be indented from the second side wall, or is formed along the second side wall to be indented from the first side wall.

6. The etching method of claim 5, wherein the forming the vertical structure comprises:
    forming a floating structure in the vertical structure to protrude from the second side wall when the indented structure is formed along the first side wall, and
    forming the floating structure in the vertical structure to protrude from the first side wall when the indented structure is formed along the second side wall.

7. The etching method of claim 1, wherein the compensation pattern comprises a right angle pattern or a round pattern.

8. The etching method of claim 1, wherein the opening pattern of the mask has a polygonal shape, and
    the compensation pattern is formed at one or more corners of the opening pattern having the polygonal shape.

9. The etching method of claim 1, wherein the substrate comprises a silicon substrate.

10. The etching method of claim 1, wherein the vertical structure corresponds to a back cavity or a through-hole.

11. The etching method of claim 1, wherein the compensation pattern is formed along a first side of two adjacent sides of the opening pattern to be indented from a second of the two adjacent sides,
    when a width and a length of the compensation pattern are respectively W and L, and a distance between a floating structure that protrudes from a second side wall of the vertical structure corresponding to the second side, and a first side wall of the vertical structure corresponding to the first side, is D,
    a size of the compensation pattern and the distance between the floating structure and the first side satisfy any one of
    a first condition in which $50<W$ and $D>200$,
    a second condition in which $50<W<150$, $L \geq 1.3W$, and $D>W$, and
    a third condition in which $150 \leq W$, $L \geq W$, and $D>W$.

12. A method of manufacturing an electronic device comprising the vertical structure of claim 1.

13. An etching method for forming a vertical structure, the etching method comprising:
    positioning a mask on a substrate, the mask comprising an opening pattern and a compensation pattern, the compensation pattern being disposed at a corner of two adjacent sides of the opening pattern, and comprising a concave compensation pattern that is indented from one of the two adjacent sides; and
    forming the vertical structure on the substrate through the opening pattern of the mask by a dry etching process,
    wherein the opening pattern of the mask comprises a plurality of steps, and
    the concave compensation pattern is formed in at least one step of the plurality of steps to extend from the at least one step or to be indented from the at least one step.

14. An electronic device comprising:
    an electronic sensor comprising a vertical structure and a floating structure that are disposed on a substrate,
    wherein the vertical structure comprises an indented structure disposed at a corner of two adjacent side walls,
    wherein the floating structure protrudes from one of the two adjacent side walls of the vertical structure, and
    wherein the vertical structure is formed in the substrate by positioning a mask on the substrate, and wherein an opening pattern of the mask comprises a compensation pattern that is disposed at a corner of the opening pattern and is indented from the corner of the opening pattern towards an outer boundary of the mask.

15. The electronic device of claim 14, wherein the electronic sensor is a sound sensor configured to detect a sound signal through the vertical structure and the floating structure, or a pressure sensor configured to detect a pressure signal through the vertical structure and the floating structure.

16. The electronic device of claim 14, wherein the vertical structure is formed in the substrate by applying an etching method,
wherein the etching method comprises:
positioning the mask on the substrate, and
forming the vertical structure on the substrate through the opening pattern of the mask by a dry etching process,
wherein the compensation pattern is formed along a first side of the opening pattern to be indented from a second side of the opening pattern that is adjacent to the first side,
when a width and a length of the compensation pattern are respectively W and L, and a distance between the floating structure that protrudes from a second side wall of the vertical structure corresponding to the second side, and a first side wall of the vertical structure corresponding to the first side, is D,
the vertical structure is formed in the substrate such that a size of the compensation pattern and the distance between the floating structure and the first side satisfy any one of
a first condition in which 50<W and D>200,
a second condition in which 50<W<150, L≥1.3W, and D>W, and
a third condition in which 150≤W, L≥W, and D>W.

17. The electronic device of claim 16, wherein the substrate includes a silicon substrate.

18. The electronic device of claim 16, wherein the vertical structure corresponds to a back cavity or a through-hole having the first and the second side walls.

19. The electronic device of claim 16, the vertical structure is formed in a state in which the floating structure is coupled to the substrate.

20. The electronic device of claim 16, is coupled to the substrate after the vertical structure is formed.

21. The electronic device of claim 16, wherein the vertical structure corresponds to a through-hole,
the floating structure comprises a support portion extending from the substrate, and
the through-hole is formed around the support portion.

* * * * *